(12) United States Patent
Chen et al.

(10) Patent No.: US 12,362,326 B2
(45) Date of Patent: Jul. 15, 2025

(54) SEMICONDUCTOR PACKAGE AND METHOD OF MANUFACTURING SEMICONDUCTOR PACKAGE

(71) Applicant: Taiwan Semiconductor Manufacturing Co., Ltd., Hsinchu (TW)

(72) Inventors: Hsien-Wei Chen, Hsinchu (TW); Ming-Fa Chen, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/366,747

(22) Filed: Aug. 8, 2023

(65) Prior Publication Data

US 2023/0395573 A1 Dec. 7, 2023

Related U.S. Application Data

(62) Division of application No. 17/314,713, filed on May 7, 2021, now Pat. No. 11,908,836.

(Continued)

(51) Int. Cl.
*H01L 25/00* (2006.01)
*H01L 21/48* (2006.01)
(Continued)

(52) U.S. Cl.
CPC ...... *H01L 25/0657* (2013.01); *H01L 21/4857* (2013.01); *H01L 21/565* (2013.01); *H01L 21/568* (2013.01); *H01L 21/6835* (2013.01); *H01L 21/76898* (2013.01); *H01L 23/3128* (2013.01); *H01L 23/481* (2013.01); *H01L 23/5383* (2013.01); *H01L 23/5386* (2013.01);
(Continued)

(58) Field of Classification Search
CPC ............. H01L 25/0657; H01L 23/3128; H01L 23/481; H01L 23/5386; H01L 24/08
See application file for complete search history.

(56) References Cited

U.S. PATENT DOCUMENTS 8,563,403 B1 10/2013 Farooq et al.
8,786,054 B2 7/2014 Harn et al.
(Continued)

FOREIGN PATENT DOCUMENTS

KR 20030002476 A 1/2003
KR 20150125548 A 11/2015
(Continued)

*Primary Examiner* — Trang Q Tran
(74) *Attorney, Agent, or Firm* — Slater Matsil, LLP

(57) ABSTRACT

A semiconductor package includes a first die, a second die, an encapsulating material, and a redistribution structure. The second die is disposed over the first die and includes a plurality of bonding pads bonded to the first die, a plurality of through vias extending through a substrate of the second die and a plurality of alignment marks, wherein a pitch between adjacent two of the plurality of alignment marks is different from a pitch between adjacent two of the plurality of through vias. The encapsulating material is disposed over the first die and at least laterally encapsulating the second die. The redistribution structure is disposed over the second die and the encapsulating material and electrically connected to the plurality of through vias.

20 Claims, 24 Drawing Sheets

Related U.S. Application Data

(60) Provisional application No. 63/136,761, filed on Jan. 13, 2021.

(51) Int. Cl.

| | | |
|---|---|---|
| *H01L 21/56* | (2006.01) | |
| *H01L 21/683* | (2006.01) | |
| *H01L 21/768* | (2006.01) | |
| *H01L 23/00* | (2006.01) | |
| *H01L 23/31* | (2006.01) | |
| *H01L 23/48* | (2006.01) | |
| *H01L 23/538* | (2006.01) | |
| *H01L 23/544* | (2006.01) | |
| *H01L 25/065* | (2023.01) | |
| *H01L 25/10* | (2006.01) | |

(52) U.S. Cl.
CPC ........ *H01L 23/5389* (2013.01); *H01L 23/544* (2013.01); *H01L 24/08* (2013.01); *H01L 24/80* (2013.01); *H01L 25/105* (2013.01); *H01L 25/50* (2013.01); *H01L 2221/68372* (2013.01); *H01L 2223/54426* (2013.01); *H01L 2224/08145* (2013.01); *H01L 2224/80895* (2013.01); *H01L 2224/80896* (2013.01); *H01L 2225/0651* (2013.01); *H01L 2225/06541* (2013.01); *H01L 2225/06568* (2013.01); *H01L 2225/06586* (2013.01); *H01L 2225/06593* (2013.01); *H01L 2225/1035* (2013.01); *H01L 2225/1058* (2013.01); *H01L 2225/1082* (2013.01)

(56) References Cited

U.S. PATENT DOCUMENTS

| | | | |
|---|---|---|---|
| 8,957,526 | B2 | 2/2015 | Chun et al. |
| 9,478,480 | B2 | 10/2016 | Tsai et al. |
| 9,773,768 | B2 | 9/2017 | Yu et al. |
| 10,312,199 | B2 | 6/2019 | Watanabe et al. |
| 10,504,852 | B1 | 12/2019 | Chen et al. |
| 2003/0001281 | A1 | 1/2003 | Kwon et al. |
| 2015/0318264 | A1 | 11/2015 | Yu et al. |
| 2018/0138101 | A1 | 5/2018 | Yu et al. |
| 2019/0131277 | A1 | 5/2019 | Yang et al. |
| 2019/0244947 | A1* | 8/2019 | Yu .................... H01L 24/92 |
| 2019/0393159 | A1 | 12/2019 | Chen et al. |
| 2020/0006164 | A1 | 1/2020 | Yu et al. |
| 2020/0043896 | A1 | 2/2020 | Yu et al. |
| 2020/0402942 | A1 | 12/2020 | Chen et al. |

FOREIGN PATENT DOCUMENTS

| | | |
|---|---|---|
| KR | 20180054440 A | 5/2018 |
| KR | 20200002557 A | 1/2020 |
| TW | 202008530 A | 2/2020 |
| TW | 202101724 A | 1/2021 |

\* cited by examiner

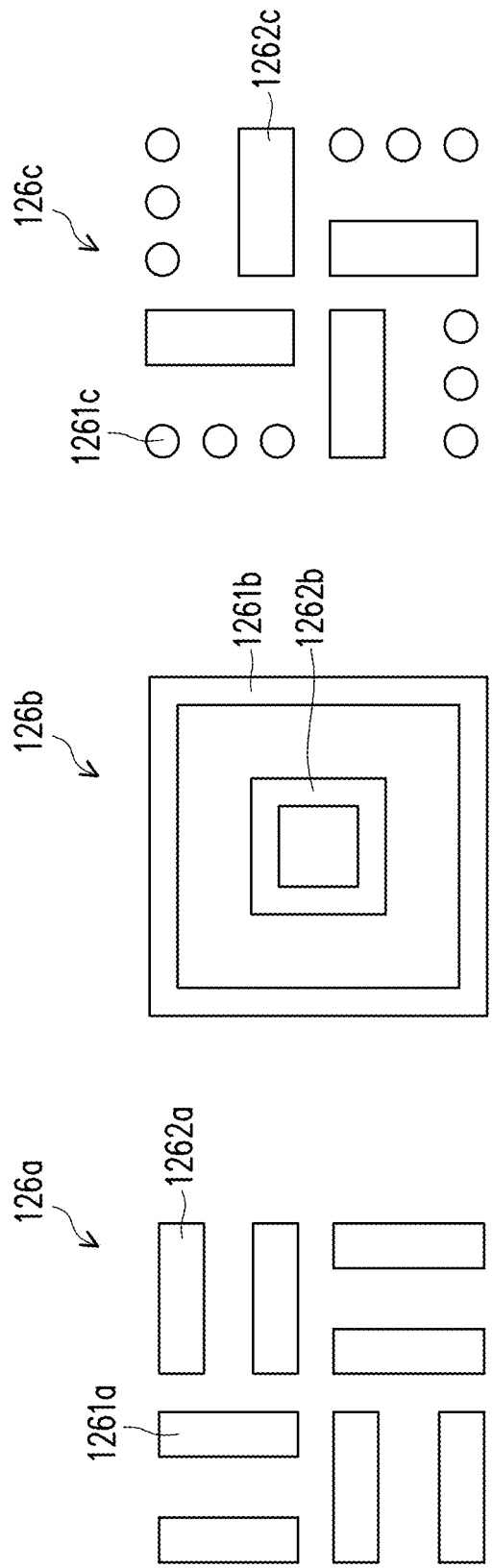

SEMICONDUCTOR PACKAGE AND METHOD OF MANUFACTURING SEMICONDUCTOR PACKAGE

PRIORITY

This application is a divisional of U.S. patent application Ser. No. 17/314,713, filed on May 7, 2021, entitled "Semiconductor Package and Method of Manufacturing Semiconductor Package," now U.S. Pat. No. 11,908,836, issued Feb. 20, 2024, which claims priority to U.S. Provisional Application No. 63/136,761, filed on Jan. 13, 2021, entitled "Package and Method of Fabricating the Same," each is hereby incorporated by reference herein in its entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various layers using lithography to form circuit components and elements thereon. Many integrated circuits are typically manufactured on a single semiconductor wafer. The dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 12 to FIG. 16 illustrate schematic top views of various alignment marks according to some embodiments of the present disclosure.

DETAILED DESCRIPTION

Figure 1:
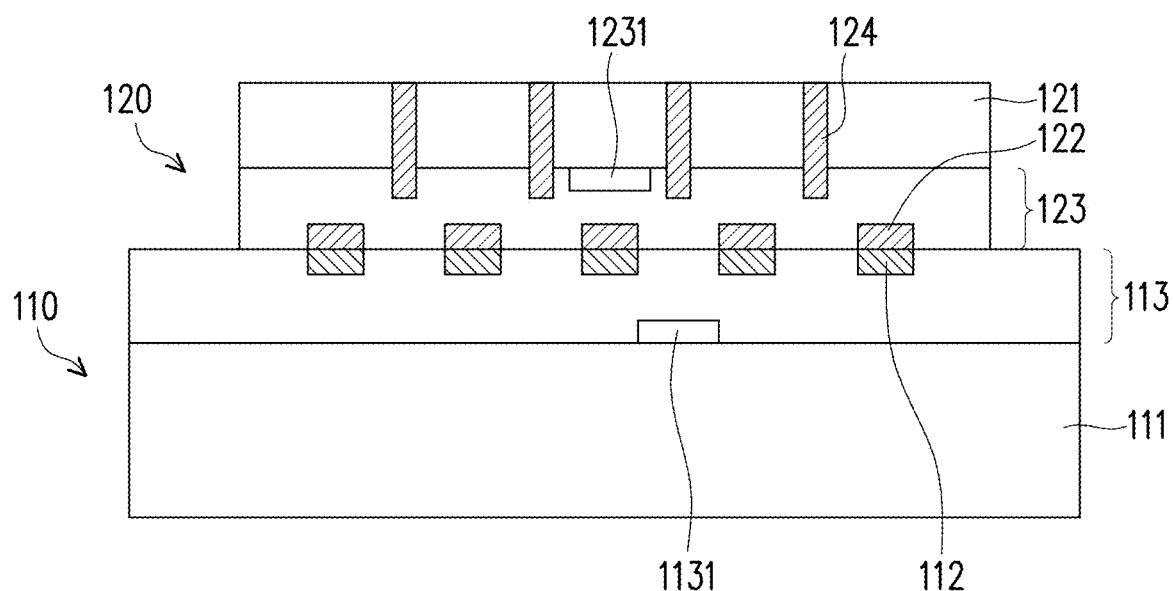
FIG. 1 to FIG. 10 illustrate cross sectional views of intermediate stages in the manufacturing of a semiconductor package according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor package and the method of manufacturing a semiconductor package are provided in accordance with various exemplary embodiments. In some embodiments, the semiconductor package may be a System on Integrate Chip (SoIC) package and the intermediate stages of forming the SoIC package are illustrated in accordance with some embodiments. Some variations of some embodiments are discussed. Throughout the various views and illustrative embodiments, like reference numbers are used to designate like elements. It is appreciated that although the formation of SoIC packages is used as examples to explain the concept of the embodiments of the present disclosure, the embodiments of the present disclosure are readily applicable to package structures and packaging methods in which the alignment marks and the through (substrate) vias are formed on one of the dies.

FIG. 1 to FIG. 10 illustrate cross sectional views of intermediate stages in the manufacturing of a semiconductor package according to some embodiments of the present disclosure. In accordance with some embodiments of the present disclosure, the manufacturing method of a semiconductor package may include the following steps.

Referring firstly to FIG. 1, a first die 110 is provided, and a second die 120 is bonded over the first die 110. In some embodiments, the first die 110 and the second die 120 may respectively be an application-specific integrated circuit (ASIC) chip, a System on Chip (SoC), an analog chip, a sensor chip, a wireless and radio frequency chip, a voltage regulator chip, a logic die such as a Central Processing Unit (CPU) die, a Micro Control Unit (MCU) die, a BaseBand (BB) die, an Application processor (AP) die, or a memory chip such as a Dynamic Random Access Memory (DRAM) die or a Static Random Access Memory (SRAM) die, or the like, other types of die, for example. The first die 110 and the second die 120 may be the same types of dies or different types of dies, and the types of the dies are not limited in the disclosure. Various suitable bonding techniques may be applied for the bonding of the first die 110 and the second die 120. For example, the second die 120 may be bonded to the first die 110 through hybrid bonding, fusion bonding, or the like, or combinations thereof. Although one die 110 and one die 120 are shown in the figures, the number of the dies 110 and 120 are not limited in the disclosure.

In some embodiments, the first die 110 may be a chip included in a semiconductor wafer in the present stage. Although one die 110 is shown, it is understood that the semiconductor wafer includes a plurality of dies 110, and each of which locates within a die region of the wafer and spaced from each other by scribe regions. The singulation of the dies 110 may be performed in subsequent processes. The second die 120 may be a die which has been singulated from another semiconductor wafer and mounted over the first die 110 through pick-and-place processes. In some embodiments, the first die 110 and the second die 120 may have similar structures, and the detailed structure of the dies will be described below.

In some embodiments, the first die 110 includes a semiconductor substrate 111, at least one integrated circuit device 1131, an interconnection structure 113, and a plurality of conductive pads 112. The integrated circuit device 1131 may include transistors and/or diodes, passive devices (e.g., capacitors, inductors, resistors, or the like), or the like. For the purpose of brevity, the integrated circuit device 1131 is omitted in the following drawings. In accordance with some embodiments of the present disclosure, the first die 110 is a logic die, which may be a Central Processing Unit (CPU) die, a Micro Control Unit (MCU) die, an input-output (IO) die, a BaseBand (BB) die, an Application processor (AP) die, or the like. In some embodiments, the first die 110 may also be a memory die such as a Dynamic Random Access Memory (DRAM) die, a Static Random Access Memory (SRAM) die, or the like. In accordance with some embodiments of the present disclosure, the first die 110 may be an interposer wafer, free from active devices such as transistors and/or diodes. In some embodiments, the first die 110 may be free from passive devices such as capacitors, inductors, resistors, or the like, or may include passive devices.

In accordance with some embodiments of the present disclosure, the semiconductor substrate 111 may be formed of crystalline silicon, crystalline germanium, crystalline silicon germanium, and/or a III-V compound semiconductor such as GaAsP, AlInAs, AlGaAs, GaInAs, GaInP, GaInAsP, and the like. In some embodiments, the semiconductor substrate 111 may further include other features such as various doped regions, buried layer(s), and/or epitaxy layer(s). The semiconductor substrate 111 may also be a bulk silicon substrate, a Silicon-On-Insulator (SOI) substrate, or silicon on sapphire, or the like. Shallow Trench Isolation (STI) regions (not shown) may be formed in the semiconductor substrate 111 to isolate the active regions in semiconductor substrate 11. Although not shown, a plurality of through vias may be formed to extend into the semiconductor substrate 111, and the through vias may be used to electrically inter-couple the conductive features (e.g., conductive pads 112) on opposite sides of the first die 110.

In accordance with some embodiments of the present disclosure, the first die 110 includes at least one integrated circuit device 1131, which is formed on the upper surface of semiconductor substrate 111. The integrated circuit device 1131 may include a Complementary Metal-Oxide Semiconductor (CMOS) transistor, a resistor, a capacitor, a diode, a photodiode, a fuse device, or the like, or combinations thereof. The details of integrated circuit device 1131 are not illustrated herein for the sake of brevity. In accordance with some embodiments, the first die 110 is used for forming interposers, in which semiconductor substrate 111 may be a semiconductor substrate or a dielectric substrate.

In some embodiments, the first die 110 may further include an interconnect structure 113 (illustrated in an abstract form as a layer for convenience of illustration), which is formed over the semiconductor substrate 111 to electrically connect the various integrated circuit devices 1131 to form a functional circuit. The interconnection structure 113 may include metallization structures (e.g., conductive lines and vias) embedded in one or more dielectric layers, such as inter-layer dielectric layers (ILDs) and inter-metal dielectric layers (IMDs). The ILD is formed over the semiconductor substrate 111, and fills the space between the gate stacks of transistors (not shown) in integrated circuit device 1131. In accordance with some embodiments, ILD may be formed of Phospho Silicate Glass (PSG), Boro Silicate Glass (BSG), Boron-Doped Phospho Silicate Glass (BPSG), Fluorine-Doped Silicate Glass (FSG), or the like. In some embodiments, the ILD may be formed using spin coating, Flowable Chemical Vapor Deposition (FCVD), Chemical Vapor Deposition (CVD), Plasma Enhanced Chemical Vapor Deposition (PECVD), Low Pressure Chemical Vapor Deposition (LPCVD), or the like. In some embodiments, a plurality of contact vias is formed in ILD, and are used to electrically connect integrated circuit devices 1131 to overlying metal lines and vias.

The IMD layers reside over the ILD. In accordance with some embodiments of the present disclosure, some of the IMD layers (e.g., the lower IMD layers) are formed of a low-k dielectric material having a dielectric constant (k-value) lower than about 3.0 or about 2.5. The IMD layers may be formed of Black Diamond® (a registered trademark of Applied Materials), a carbon-containing low-k dielectric material, Hydrogen SilsesQuioxane (HSQ), MethylSilsesQuioxane (MSQ), or the like. In accordance with some embodiments of the present disclosure, some or all of IMD layers are formed of non-low-k dielectric materials such as silicon oxide, silicon carbide (SiC), silicon carbo-nitride (SiCN), silicon oxy-carbo-nitride (SiOCN), or the like.

In some embodiments, the metallization structures includes a plurality of conductive features interconnected to each other and embedded in the one or more dielectric layers. The conductive features may include multi-layers of conductive lines, conductive vias, and conductive contacts. The conductive contacts may be formed in the ILDs to electrically connect the conductive lines to the integrated circuit devices 1131, the conductive vias may be formed in the IMDs to electrically connect the conductive lines in different layers. The conductive features of the metallization structures may include metal, metal alloy or a combination thereof. For example, the conductive features may include tungsten (W), copper (Cu), copper alloys, aluminum (Al), aluminum alloys, or combinations thereof. In some embodiments, the topmost conductive features of the metallization structure have top surfaces substantially coplanar (e.g., within process variations) with a top surface of the dielectric structure, but the disclosure is not limited thereto.

In some embodiments, the conductive pads 112 are formed in surface dielectric layer of the interconnect structure 113. In accordance with some embodiments of the present disclosure, the conductive pads 112 are formed through a single damascene process, and may also include barrier layers and a copper-containing material formed over the respective barrier layers. In accordance with alternative embodiments of the present disclosure, the conductive pads 112 are formed through a dual damascene process. The top surface dielectric layer and the conductive pads 112 are planarized so that their top surfaces are coplanar within process variations, which may be resulted due to the CMP in the formation of the conductive pads 112. The conductive pads 112 are configured for bonding to other device dies (e.g., second die 120).

Still referring to FIG. 1, in some embodiments, the second die 120 includes a structure that may be similar to the first die 110. For example, the second die 120 includes a substrate 121, at least one integrated circuit device 1231, an interconnection structure 123 (illustrated in an abstract form as a layer for convenience of illustration), and a plurality of bonding pads 122 bonded to the conductive pads 112 of the first die 110. The interconnection structure 123 is formed over the substrate 121 to electrically connect the various integrated circuit devices 1231 to form a functional circuit. The materials and configurations of the substrate 121, the integrated circuit device 1231, the interconnection structure 123, and the bonding pads 122 of the second die 120 may be substantially similar and formed using similar processes and/or materials as those described above regarding the first die 110, which are not described again here.

In accordance with some embodiments of the present disclosure, the second die 120 may include a logic die such as Central Processing Unit (CPU) die, a Micro Control Unit (MCU) die, an input-output (IO) die, a BaseBand (BB) die, an Application processor (AP) die, or the like. In some embodiments, the second die 120 may also include a memory die such as a Dynamic Random Access Memory (DRAM) die, a Static Random Access Memory (SRAM) die, or the like. In addition, a plurality of second dies 120 may be bonded over the first die 110 and the second dies 120 may be different types of dies selected from the above-listed types. In addition, one of the second dies 120 may be a digital circuit die, while the other may be an analog circuit die. In some embodiments, the first die 110 may be a logic die while the second die 120 may be a memory die, and the die 110, 120 in combination function as a system. Splitting the functions and circuits of a system into different dies such as dies 110 and 120 may optimize the formation of these dies, and may achieve the reduction of manufacturing cost.

In some embodiments, the second die 120 further includes a plurality of through (substrate) vias 124, which may be formed in the substrate 121 and electrically connected to conductive features in the interconnection structure 123 and the bonding pads 122. In some embodiments, the through vias 124, sometimes referred to as through semiconductor vias or through substrate vias, are formed to penetrate through semiconductor substrate 121. The through vias 124 are used to connect the integrated circuit devices 1231 and metal lines formed on the front side (the illustrated bottom side) of substrate 121 to the backside. In some embodiments, the through vias 124 may extend into the interconnection structure 123 to be in physical and electrical contact with the conductive features of the interconnection structure 123. In some embodiments, the through via 124 may include liner(s) (not shown) for covering surface thereof. The liner is disposed between the through via 124 and the substrate 121 to separate the through via 124 from the substrate 121. The liner may surround the sidewalls and/or top surface of the through via 124. The through via 124 may include copper, copper alloys, aluminum, aluminum alloys, Ta, TaN, Ti, TiN, CoW or combinations thereof. The liner may include dielectric material, such as silicon oxide, silicon nitride, silicon oxynitride or the like, or combinations thereof.

In some embodiments, the second die 120 is bonded to the first die 110 through a hybrid bonding process, and the hybrid bonding involves at least two types of bonding, including metal-to-metal bonding and non-metal-to-non-metal bonding such as dielectric-to-dielectric bonding, for example. In other words, the bonding pads 122 of the second die 120 are in direct contact with the conductive pads 112 of the first die 110 respectively. In some embodiments, the bonding pads 122 of the second die 120 are bonded to the conductive pads 112 of the first die 110 through metal-to-metal bonding, while the dielectric layer of the second die 120 is bonded to the dielectric layer of the first die 110 through dielectric-to-dielectric bonding. In accordance with some embodiments of the present disclosure, the metal-to-metal bonding may include copper-to-copper direct bonding. Furthermore, the dielectric-to-dielectric bonding may include fusion bonding. In some embodiments, the bonding process may include the following steps. Firstly, to avoid the occurrence of the un-bonded areas (i.e. interface bubbles), the to-be-bonded surfaces of the second die 120 and the first die 110 may be processed to be sufficiently clean and smooth the bonding surface. Then, the second die 120 may be picked and placed on the first die 110. In some embodiments, the first die 110 and the second die 120 are aligned and placed in physical contact at room temperature with slight pressure to initiate a bonding operation. Thereafter, a thermal treatment such as an annealing process is performed to cause the inter-diffusion of the metals in the conductive pads 112 of the first die 110 and the corresponding overlying bonding pads 122 of the second die 120, and to transform the chemical bonds into covalent bonds. The bonding pads 122 may have sizes greater than, equal to, or smaller than, the sizes of the respective conductive pads 112.

Through the hybrid bonding, the bonding pads 122 are bonded to the corresponding conductive pads 112 through direct metal bonding caused by metal inter-diffusion. The dielectric layer of the second die 120 is also bonded to the dielectric layer of the first die 110, with bonds formed therebetween. For example, the atoms (such as oxygen atoms) in one of the dielectric layers of the second die 120 form chemical or covalent bonds with the atoms (such as silicon atoms) in the one of dielectric layers of the first die 110. The resulting bonds between dielectric layers of the first die 110 and the second die 120 are dielectric-to-dielectric bonds. In other words, a bonding interface exists between the first die 110 and the second die 120. In some embodiments, the bonding interface is a hybrid bonding interface including a metal-to-metal bonding interface between the conductive pads 112 and the bonding pads 122, and a dielectric-to-dielectric bonding interface between the dielectric layers of the first die 110 and the second die 120.

In some embodiments, the second die 120 is bonded to the first die 110 in a face-to-face configuration. That is, the front (active) surface of the second die 20 faces the front surface of the first die 110. However, the disclosure is not limited thereto. In some embodiments, the second die 120 may be bonded to the first die 110 in a face-to-back configuration. In other words, the front surface of the second die 120 may face the back surface of the first die 110. Throughout the specification, a "front surface" of a die refers to a surface having the devices (e.g., the integrated circuit device 1131/1231) or close to the conductive pads (e.g., the conductive pads 112/122), and may also be referred to as an active surface. A "back surface" of a die is a surface opposite to the front surface and may be a surface of the substrate, which may also be referred to as a rear surface.

Although two device dies 110, 120 are illustrated, the hybrid bonding may be performed at wafer level, and a plurality of device die groups identical or similar to the illustrated die group (which includes device dies 110 and 120) are pre-bonded, and arranged as rows and columns. In some embodiments, the hybrid bonding may also be a die to wafer bonding process. The disclosure is not limited thereto.

Figure 2:
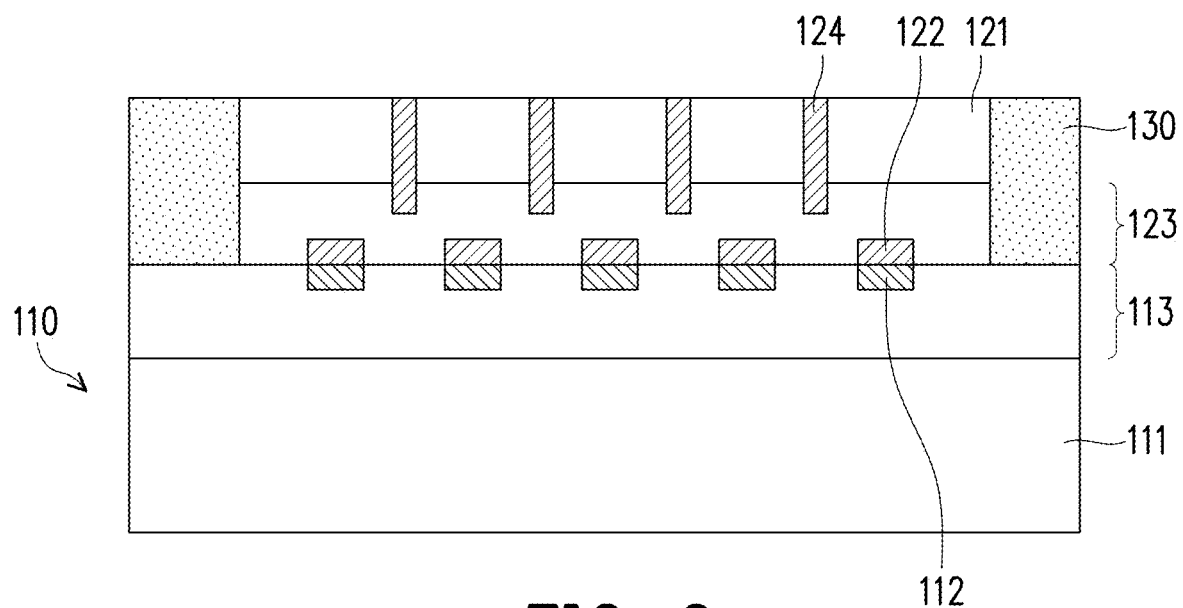

With reference to FIG. 2, in some embodiments, after the second die 120 is bonded to the first die 110, a backside grinding process may be performed to thin the second die 120 and reveal the through vias 124. As shown in FIG. 2, in some embodiments, the through vias 124 may extend through the substrate 121 and be revealed from the top surface (e.g., back surface) of the second die 120, the top surfaces of the through vias 124 may be substantially coplanar, within process variations, with the top surface (e.g. back surface) of the substrate 121. In some embodiments, the through vias 124 may not be revealed at this time, and the backside grinding is stopped when there is a thin layer of substrate 121 covering the through vias 124. In some embodiments, the backside grinding process may be skipped. In some embodiments, the through vias 124 may be revealed in the step shown in FIG. 2 or FIG. 3.

Still referring to FIG. 2, an encapsulating material 130 is provided over the first die 110 to cover sidewalls and top surface of the second die 120. In some embodiments, the encapsulating material 130 may be a molding compound, a molding underfill, an epoxy, a resin, the like, or the combination thereof. In such embodiments, the encapsulating material 130 may be formed by a molding process, a molding underfilling (MUF) process, or the like. In some embodiments, the encapsulating material 130 may include silicon oxide, or TEOS, while other dielectric materials such as silicon carbide, silicon oxynitride, silicon oxy-carbo-nitride, PSG, BSG, BPSG, or the like may also be used. In such embodiments, the encapsulating material 130 may be formed using CVD, High-Density Plasma Chemical Vapor Deposition (HDPCVD), Flowable CVD, spin-on coating, or the like.

In some embodiments, the top surface of encapsulating material 130 may be initially higher than the back surface of second die 120, which means the encapsulating material 130 covers the back surface of second die 120. Then, a planarization process is performed to remove a portion of the encapsulating material 130 over the top of the second die 120, so that the encapsulating material 130 laterally encapsulates the second die 120. The planarization process may include a chemical mechanical polishing (CMP) process. In some embodiments in which the through vias 124 is not revealed in the step of FIG. 1, the planarization process may further remove a portion of the substrate 121 over the top of the through vias 124 to reveal the through vias 124.

In some embodiments, multiple planarization processes may be performed. For example, in some embodiments a first planarization process may be performed on the structure illustrated in FIG. 1 to initially thin the second die 120. After this first planarization process, the through vias 124 may remained covered by the substrate 121. After this first planarization, the encapsulating material 130 may be formed and then a second planarization process may be performed to remove excess encapsulating material 130 and to further thin the substrate 121 to expose the through visa 124.

After forming the encapsulating material 130 and performing the one or more planarization processes, the encapsulating material 130 covers a portion of the top surface of the first die 110 and the sidewalls of the second die 120. In some embodiments, the top surface of the encapsulating material 130 is substantially coplanar, within process variations, with the top surface of the second die 120. In an embodiment, the top surface of the encapsulating material 130 is substantially coplanar, within process variations, with the top surface (e.g. back surface) of the substrate 121 and the top surface of the through vias 124 of the second die 120. In some embodiments, the encapsulating material 130 may also be referred to as a gap-filling dielectric layer or an insulation structure or a dielectric structure.

Figure 3:
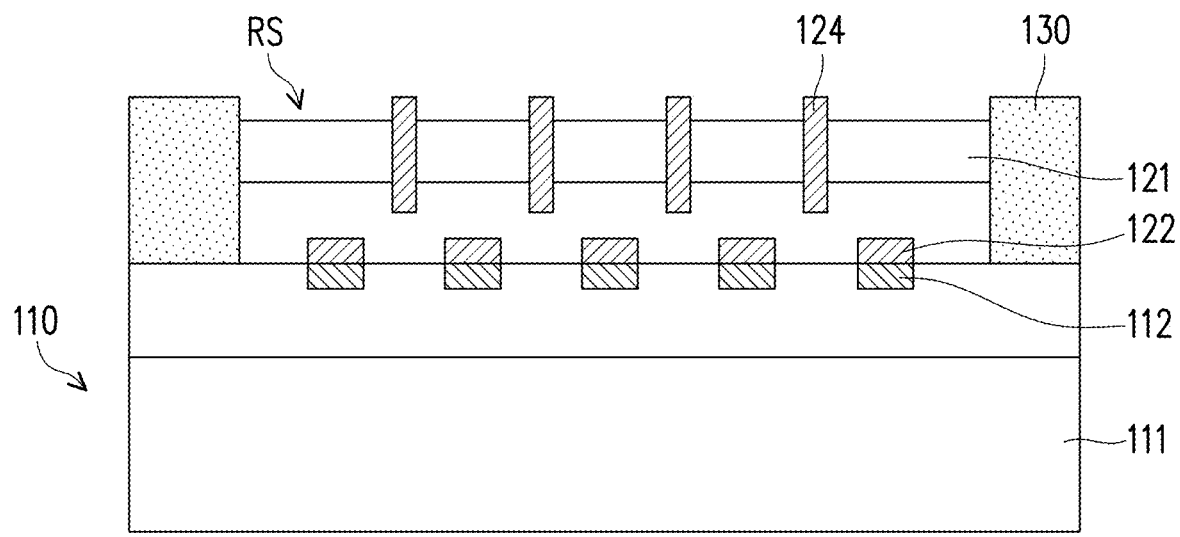

Referring to FIG. 3, in some embodiments, removing a back portion of the substrate 121 of the second die 120, such that the through vias 124 protrude from the back of the substrate 121, and recesses RC are formed across the substrate 121. In some embodiments, the encapsulating material 130 and the through vias 124 define sidewalls of the recesses RC. In some embodiments, the removal of the back portion of the substrate 121 is achieved by further thinning the substrate 121. For example, the back portion of the substrate 121 laterally aside the through vias 124 may be removed by an etching process, such as wet etching process, dry etching process, or a combination thereof. The etching process may a high etching selectivity ratio between the substrate 121 and other adjacent materials (e.g., the encapsulating material 130, the through vias 124, etc.). In some embodiments, the encapsulating material 130 may be substantially not removed by the etching process, but the disclosure is not limited thereto. In some embodiments, a portion of the encapsulating material 130 may also be removed by the etching process. After the thinning (e.g., by etching) process is performed, the top surface of the substrate 121 is lower than the top surface of the through vias 124 and the top surface of the encapsulating material 130. In other words, the through vias 124 has a portion protruded from the top surface of the substrate 121. In some embodiments, the recesses RC may have a depth in a range from about 0.5 µm to about 2 µm.

Figure 4:
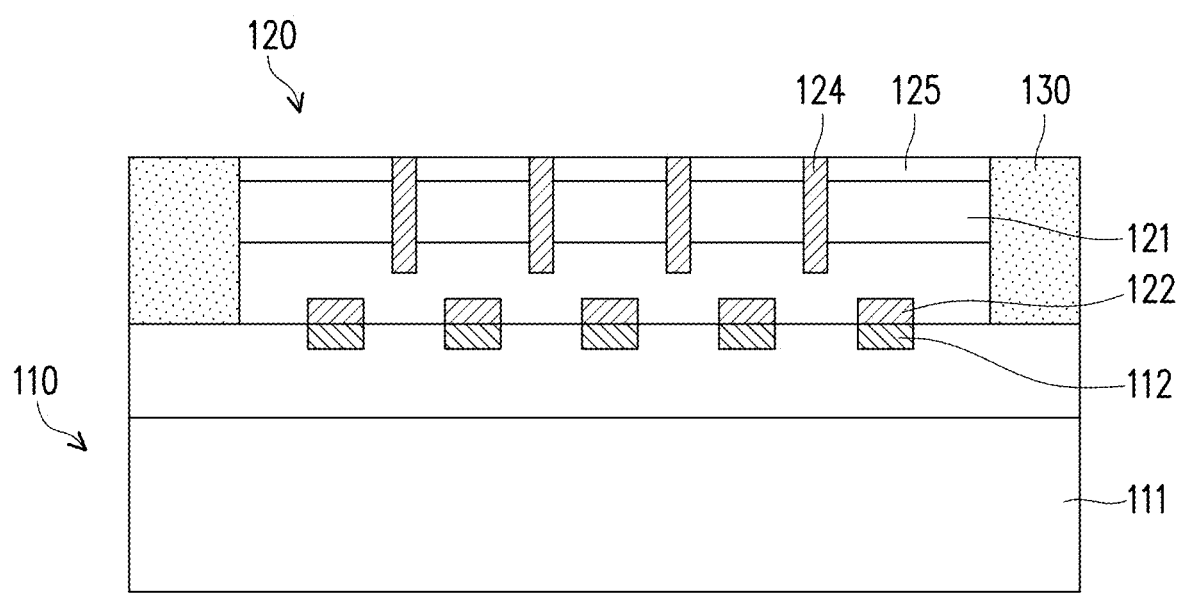

With now reference to FIG. 4, an isolation layer 125 is provided over the substrate 121 of the second die 120 and the encapsulating material 130 to cover the top surface of the substrate 121. In some embodiments, the isolation layer 125 may also cover the top surfaces of the through vias 124 and the top surface of the encapsulating material 130. In some embodiments, the isolation layer 125 is a conformal layer, that is, the isolation layer 125 has a substantially equal thickness extending along the region on which the isolation layer 125 is formed. The isolation layer 125 may include a dielectric material such as silicon nitride (SiN), HDP OX(SiO$_2$), TEOS OX(SiO$_2$), silicon oxide, silicon carbide (SiC), silicon oxycarbide (SiOC), silicon oxynitride (SiON), oxygen-doped silicon carbide, nitrogen-doped silicon carbide, a polymer, which may be a photo-sensitive material such as PBO, polyimide, or BCB, a low-K dielectric material such as PSG, BPSG, FSG, SiO$_x$C$_y$, SOG, spin-on polymers, silicon carbon material, compounds thereof, composites thereof, combinations thereof, or the like may also be used for the isolation layer 125. The isolation layer 125 may be formed using a suitable deposition process, such as CVD, atomic layer deposition (ALD), or the like. In some embodiments, the isolation layer 125 is formed to have a thickness at least equal to the height of the recesses RC (i.e. the thickness of the portion of the through vias 124 protruded from the substrate 121). In other words, the isolation layer 125 fully fills the recesses RC.

Then, a planarization process is performed to remove a portion of the isolation layer 125 over the top of the through vias 124, so as to reveal the through vias 124, and an isolation layer 125 is formed. As such, the through vias 124 extend through the isolation layer 125. The planarization process may include a CMP process. As such, the isolation layer 125 is located on the substrate 121 and laterally encapsulates the portions of the through vias 124 protruding from the substrate 121. In some embodiments, the isolation layer 125 is laterally between the through vias 124 and the encapsulating material 130. The top surface of the isolation layer 125 may be substantially coplanar, within process variations, with the top surfaces of the through vias 124 and the top surface of the encapsulating material 130. In some embodiments, the formation of the isolation layer 125 shown in FIG. 3 to FIG. 4 may be omitted. In some embodiments, the isolation layer may be formed before forming the encapsulating material 130, and the isolation layer may be formed extending along the top surface and sidewalls of the second die 120 and the top surface of the first die 110. In some embodiments, the isolation layer may further extend to cover the top surface of the encapsulating material 130. In some embodiments, the isolation layer 125 may have a thickness in a range from about 0.5 µm to about 2 µm.

Figure 5:
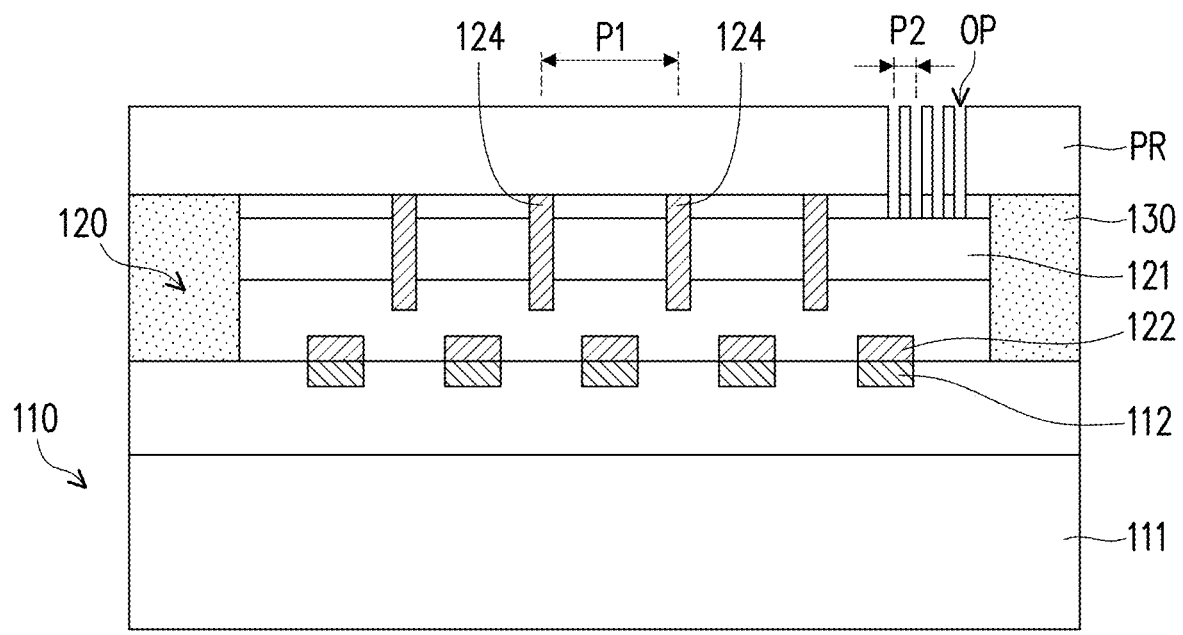
Figure 6:
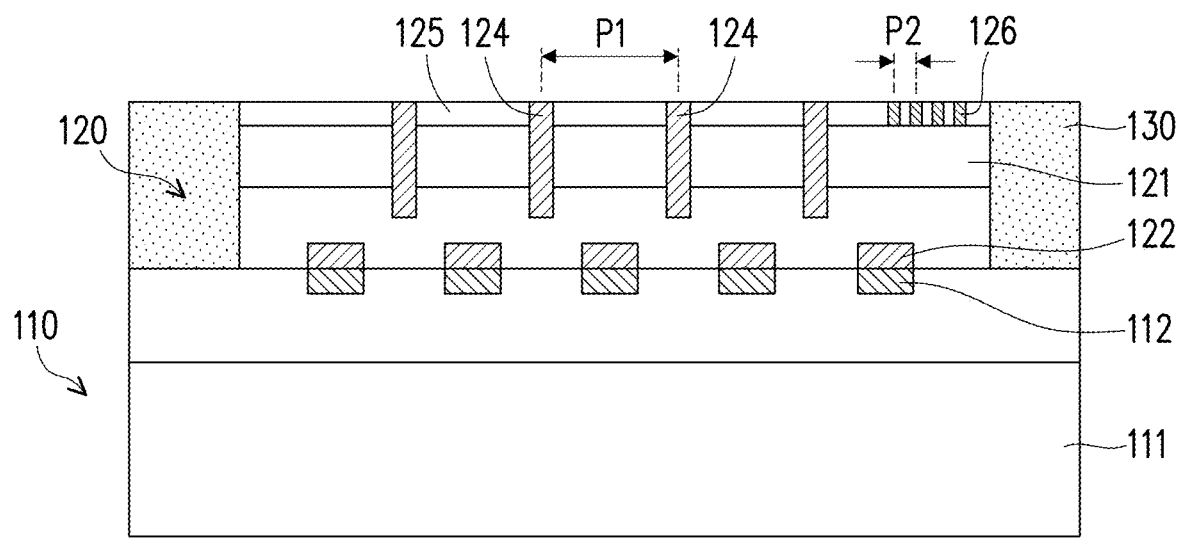

With now reference to FIG. 5 and FIG. 6, a plurality of alignment marks 126 is formed on the second die 120. In some embodiments, the formation of the alignment marks 126 may include the following steps. First, a mask layer PR is provided over the top surface of the second die 120 (e.g., the isolation layer 125). The mask layer PR may include photosensitive material, which includes organic materials, and may be a positive photosensitive material or a negative photosensitive material. The mask layer PR is placed over the isolation layer 125 using, e.g., a spin-on technique. Once in place, the mask layer PR may be exposed to a patterned energy source (e.g., a patterned light source) so as to induce a chemical reaction in those portions of the mask layer PR exposed to the patterned light source. A developer is then applied to the exposed mask layer PR to take advantage of the physical changes and selectively remove either the exposed portion of the mask layer PR or the unexposed portion of the mask layer PR, depending upon the desired pattern and form the desired pattern (e.g., openings on the mask layer PR) for the alignment marks 126. Other masking materials may be used instead of or in addition to the photosensitive material.

Once the mask layer PR has been patterned, the pattern of the mask layer PR is transferred to the isolation layer 125 (and may be the substrate 121 of the second die 120) using an etching process. That is, the etching process is performed to form a plurality of openings OP on the isolation layer 125. The etching process is anisotropic, so that the openings in the mask layer PR are extended through the isolation layer 125 and have about the same sizes (or are slightly smaller) in the isolation layer 125 as they do in the mask layer PR.

Then, the alignment marks 126 are formed within the openings OP. In one of the embodiments, the alignment marks 126 are formed by filling the openings OP with a material different than the surrounding material. In some embodiments, the alignment marks comprise a conductive material that may be easily distinguishable from the surrounding material. For example, the alignment marks 126 may include one or more conductive materials, such as copper, tungsten, other conductive metals, or the like, and may be formed, for example, by electroplating, electroless plating, or the like. The conductive material of the alignment marks 126 may be the same as that of the through vias 124. In some embodiments, the conductive material of the alignment marks 126 may be different from the conductive material of the through vias 124 since they are formed by different processes in separate steps. In other embodiments, the alignment marks 126 are formed by filling the openings OP with dielectric material, which will be described below.

Then, the mask layer PR may be removed using a suitable removal process, such as an ashing process. In an embodiment, a plasma ashing process may be used to remove the mask layer PR, whereby the temperature of the mask layer PR may be increased until the mask layer PR experiences a thermal decomposition and may be removed. However, any other suitable process, such as a wet strip, may alternatively be utilized. In some embodiments, a planarization process may be performed on the top surfaces of the isolation layer 125, the through vias 124 and the alignment marks 126. The planarization process may include a grinding process. The resulting structure is shown in FIG. 6. Due to the planarization process, the top surfaces of the through vias 124 are substantially level with the top surfaces of the alignment marks 126, and are substantially level with the top surface of the isolation layer 125. In some embodiments, the alignment marks 126 may have a thickness in a range from about 0.3 µm to about 3 µm.

Figure 11:
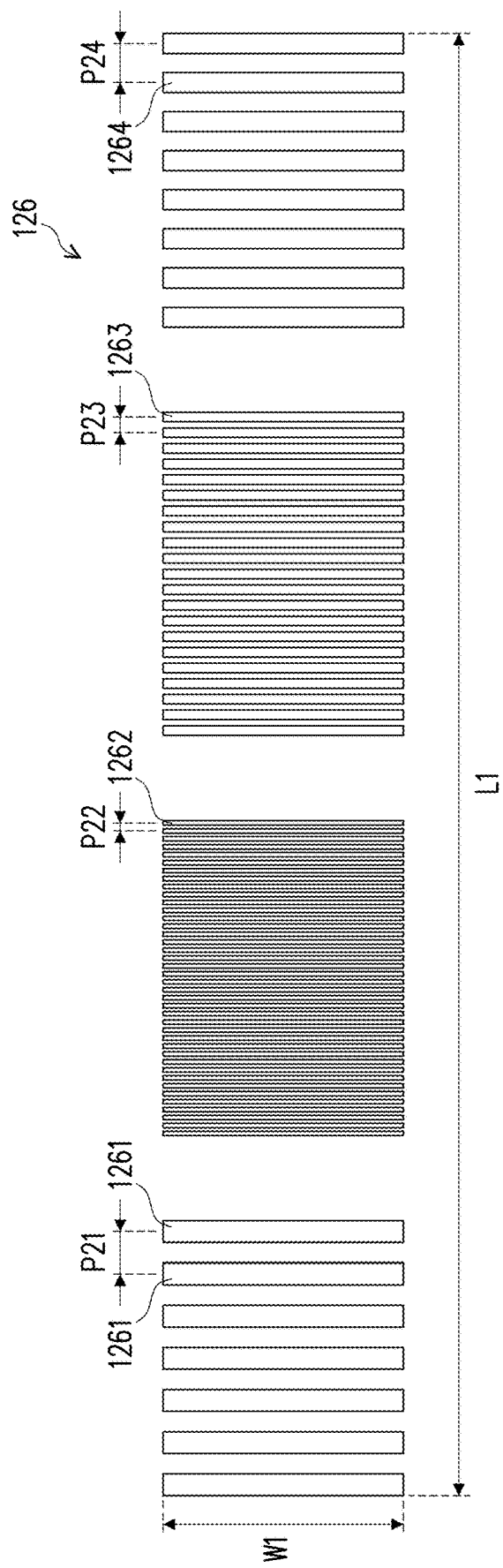
FIG. 11 illustrates a schematic view of alignment marks of a semiconductor package according to some embodiments of the present disclosure.

FIG. 11 illustrates a schematic view of alignment marks of a semiconductor package according to some embodiments of the present disclosure. With now reference to FIG. 6 and FIG. 11, in accordance with some embodiments of the disclosure, since the alignment marks 126 and the through vias 124 are formed by different processes in separate steps, the pitch P2 between adjacent two of the alignment marks 126 may be different from the pitch P1 between adjacent two of the through vias 124. In some embodiments, the sizes (e.g., diameters, depth) of the alignment marks 126 may also be different from that of the through vias 124. In some embodiments, the pitch P2 of the alignment marks 126 is substantially smaller than the pitch P1 of the through vias 124. In some embodiments, the alignment marks 126 may have different set of pitches P21, P22, P23, P24 as shown in FIG. 11. In some embodiments, the alignment marks 126 may be composed of a plurality of subsets of alignment marks 1261, 1262, 1263, 1264, and the corresponding pitches P21, P22, P23, P24 of the sub sets of alignment marks 1261, 1262, 1263, 1264 are different from one another. For example, the pitches P21 and the diameters of the alignment marks 1261 may be in a range from about 7 μm to about 9 μm (e.g., 8 μm), the pitches P22 and the diameters of the alignment marks 1262 may be in a range from about 1 μm to about 2 μm (e.g., 1.6 μm), the pitches P23 and the diameters of the alignment marks 1263 may be in a range from about 0.5 μm to about 0.8 μm (e.g., 1.15 μm), and the pitches P24 and the diameters of the alignment marks 1264 may be in a range from about 8 μm to about 10 μm (e.g., 8.8 μm). In some embodiments, the pitches P1 of the through vias 124 may be about 2 μm to about 6 μm, and the diameter of each through via 124 may be about 2 μm. However, the dimensions and numbers listed above are merely for illustration purposes, and the disclosure is not limited thereto. Accordingly, the flexibility in design of the alignment marks 126 is increased and the alignment marks 126 are able to meet fine pitch requirement (at least smaller than or about equal to 2 μm) for better resolution. In some embodiments, the pitch P2 between adjacent two of the alignment marks 126 can be 0.4 μm or less. In some embodiments, a total length L1 of the alignment marks 126 (including the lengths of the alignment marks 1261, 1262, 1263, 1264) is about 800 μm to 830 μm (e.g., 822 μm), and a width W1 of the alignment marks 126 is about 50 μm to about 70 μm (e.g., 60 μm), but the disclosure is not limited thereto.

In accordance with some embodiments of the disclosure, the alignment marks 126 allows for identification of a proper orientation of the die. In some embodiments, the alignment marks 126 are dummy structures in the sense that the alignment marks 126 are not electrically coupled to the bonding pads 122 or the through vias 124. In some embodiments, the alignment marks 126 may be electrically coupled to the bonding pads 122 and subsequently formed 140 140 through the through vias 124. In some embodiments, the alignment marks 126 may be grounded. The alignment marks 126 may include a photo alignment mark, a scanning electron microscope (SEM) mark, and other alignment mark. The alignment marks 126 may provide a feature for alignment during photolithography processing, test, inspection, or measurement.

Figure 7:
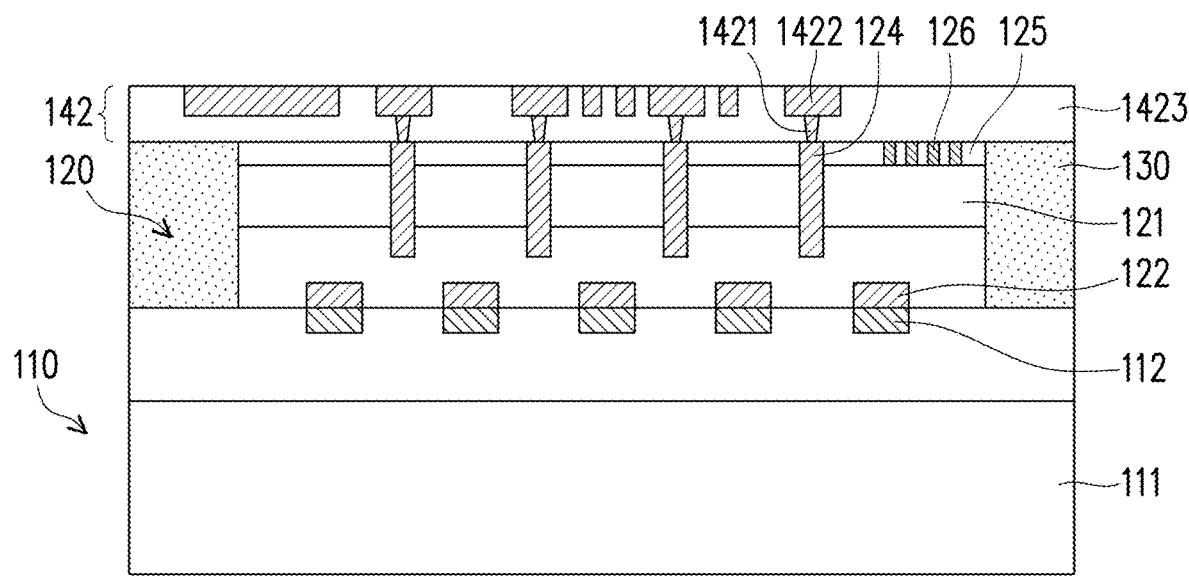
Figure 8:
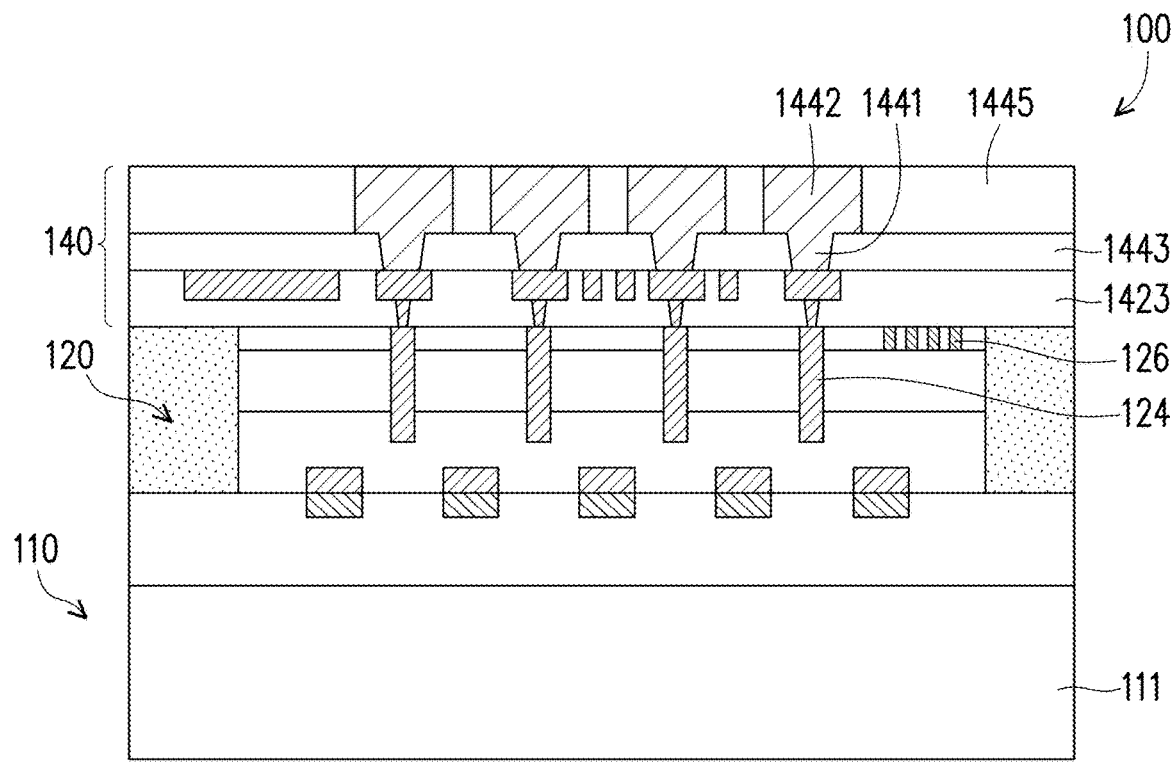

With reference to FIG. 7 and FIG. 8, a redistribution structure 140 (see FIG. 8) is formed over the second die 120 (e.g., the isolation layer 125) and the encapsulating material 130. As such, the isolation layer 125 is disposed between the substrate 121 of the second die 120 and the redistribution structure 140, and the alignment marks 126 extend from an upper surface of the isolation layer 125 facing the redistribution structure 140 and extend toward the substrate 121 of the second die 120. FIG. 7 illustrates the formation of the first layer 142 of the redistribution structure 140. In detail, for example, one or more dielectric layers, collectively referred to as a dielectric layer 1423 for illustrative purposes, may be formed over the second die 120 and the encapsulating material 130 to cover the top surfaces of the second die 120 (e.g., the isolation layer 125) and the encapsulating material 130. The dielectric layer 1423 may include an oxide such as silicon oxide, a nitride such as silicon nitride, USG, or the like, or combinations thereof. The dielectric layer 1423 may be formed by a suitable deposition process such as CVD. Then, a plurality of the through dielectric vias 1421 and the redistribution layer 1422 are formed through, for example, a single/dual damascene process. In some embodiments, in the formation of the redistribution structure 140, the alignment marks 126 may be used to identify and align the relative position between the die 120 and the features of the redistribution structure 140 (e.g., through dielectric vias and redistribution layers). In some embodiments, the alignment marks 126 do not overlap with conductive layers (e.g., through dielectric vias and redistribution layers) of the redistribution structure 140 from a top view, so the alignment marks 126 would not be block during the alignment process.

In some embodiments, a patterning process is performed to form a plurality of via holes and a plurality of trenches in the dielectric layer 1423. The patterning process removes a portion of the dielectric layer 1423 to expose the top surfaces of the through vias 124 of the second die 120. The pattering process may include multiple photolithograph and/or etching processes. The sidewalls of the via holes and the trenches may be straight or inclined. Then, the via holes and the trenches is filled with conductive material to form the through dielectric vias 1421 and the redistribution layer 1422 shown in FIG. 7. The conductive material includes a suitable metallic material, such as copper or copper alloy. In some embodiments, the forming method of the conductive material may include a plating process such as electroplating process or electro-chemical plating, or a suitable deposition process such as CVD, PVD, or the like. Thereafter, a planarization process such as a CMP process may be performed to remove excess portions of the conductive material until the dielectric layer 1423 is exposed. In some embodiments, after the planarization process is performed, the top surfaces of the through dielectric vias 1421 and the redistribution layer 1422 are substantially coplanar, within process variations, with the top surface of the dielectric layer 1423.

Referring to FIG. 8, in some embodiments, a passivation layer 1443 is formed over the dielectric layer 1423, and the vias 1441 are formed in the passivation layer 1443 to electrically connect to the redistribution layer 1422. Then, a redistribution layer (or conductive pads) 1442 are formed over the passivation layer 1443 and the vias 1441, and are electrically coupled to redistribution layer 1422 through the vias 1441. The material of the redistribution layer (or conductive pads) 1442 and the vias 1441 may respectively include a suitable metallic material, such as aluminum, copper, alloys thereof, or combinations thereof. In some embodiments, the conductive pads 1442 may be aluminum pads or aluminum-copper pads, and other metallic materials may be used. The vias 1441 and the conductive pads 1442 may be formed separately with an interface therebetween, or formed simultaneously without an interface therebetween.

In some embodiments, a passivation layer 1445 may be formed over the passivation layer 1443 to at least laterally encapsulate the conductive pads 1442. The passivation layers 1443 and 1445 may respectively be a single layer or a composite layer, and may be formed of a non-porous material. In some embodiments, each of the passivation layers 1443 and 1445 may include silicon oxide, silicon nitride, or a combination thereof. In some embodiments, one or both of passivation layers 1443 and 1445 is a composite layer including a silicon oxide layer (not shown separately), and a silicon nitride layer (not shown separately) over the silicon oxide layer. The passivation layers 1443 and 1445 may also be formed of other non-porous dielectric materials such as Un-doped Silicate Glass (USG), silicon oxynitride, and/or the like, or combinations thereof. Then, a planarization process such as a CMP process may be performed to remove excess portions of the passivation layer 1445 until the conductive pads 1442 are exposed. In some embodiments, after the planarization process is performed, the top surfaces of the conductive pads 1442 are substantially coplanar with the top surface of the passivation layer 1445.

At this point, the resultant package structure may be in a wafer form and may then be mounted (e.g. frame mounted) onto a dicing tape. Following this, the package structure may be singulated or diced (e.g. along dicing lines), thereby forming a plurality of semiconductor packages 100, each of which may be substantially identical or similar to the semiconductor package 100 shown in FIG. 8.

Figure 9:
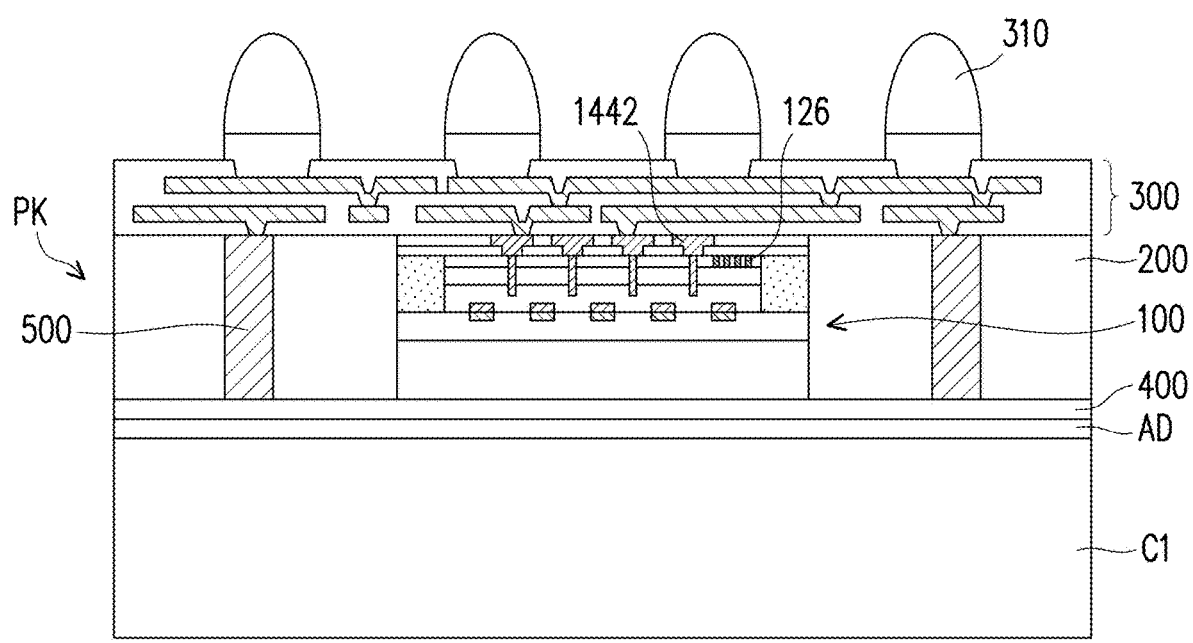
Figure 10:
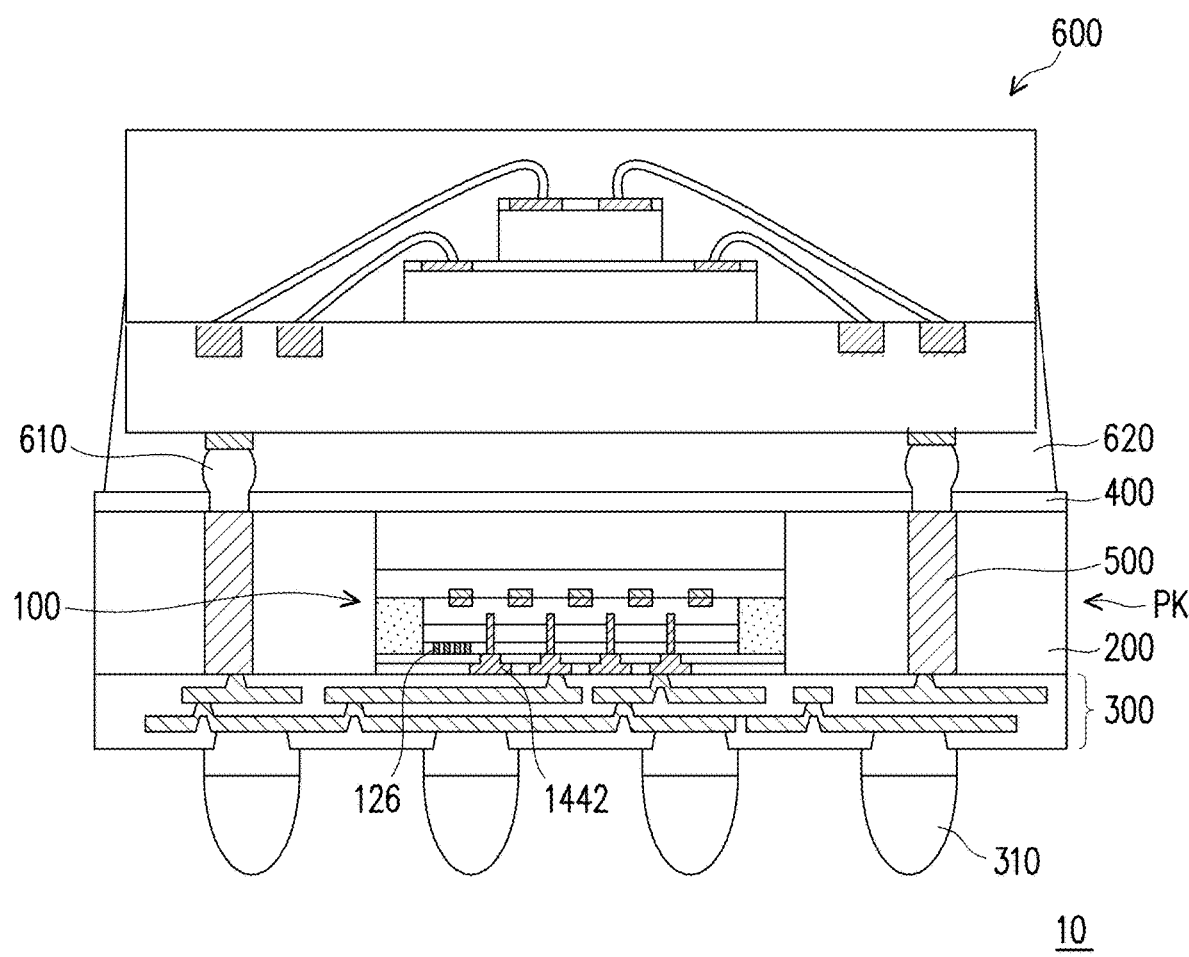

With reference to FIG. 9 and FIG. 10, in accordance with some embodiments of the disclosure, the semiconductor package 100 described above may be applied to an integrated fan-out (InFO) package process to form a package-on-package structure 10 shown in FIG. 10. In detail, in some embodiments, with now reference to FIG. 8 and FIG. 9, the semiconductor package 100 shown in FIG. 8 may be provided onto a carrier C1 such that a back surface of the semiconductor substrate 111 of the first die 110 is attached facing the carrier C1. In some embodiments, the carrier C1 may be a glass carrier, a ceramic carrier, or the like. An adhesive layer AD such as a light to heat conversion release coating (LTHC), or the like, may be disposed on the carrier C1. In some embodiments, a dielectric layer 400 may be optionally disposed over the carrier C1 (e.g., on the adhesive layer AD).

In the placement of the semiconductor package 100, the alignment marks 126 are used to align the position of the semiconductor package 100 (e.g., the second die 120 of the semiconductor package 100) to ensure the semiconductor package 100 is placed at the desirable location and that the semiconductor package 100 does not shift or rotate from its intended position and direction. The alignment is performed by determining the relative position of the semiconductor package 100 relative to the positions of the alignment marks 126.

In some embodiments, through interlayer vias 500 may be pre-formed, and are then placed on the carrier C1. In some embodiments, the through interlayer vias 500 may be formed by, for example, plating process. The plating of the through interlayer vias 500 may be performed before the placement of the semiconductor package 100, and may include forming a seed layer (not shown) over carrier C1, forming and patterning a photo resist layer (not shown), and plating the through interlayer vias 500 on the portions of the seed layer that are exposed through the photo resist layer. The photo resist layer and the portions of the seed layer covered by the photo resist layer may then be removed. The semiconductor package 100 may then be placed over the carrier C1. The material of the through interlayer vias 500 may include copper, aluminum, or the like. Accordingly, the bottom ends of the through interlayer vias 500 are substantially level with the back surface of the semiconductor package 100. In some embodiments, the through interlayer vias 500 may be provided after the placement of the semiconductor package 100.

Then, the semiconductor package 100 and the through interlayer vias 500 on the carrier C1 are encapsulated by an encapsulating material 200. In other words, the encapsulating material 200 is provided over the carrier C1 to at least laterally encapsulate the semiconductor package 100 (e.g., the first die 110, the encapsulating material 130, and the redistribution structure 140 shown in FIG. 8) and the through interlayer vias 500. In some embodiments, the encapsulating material 200 fills the gaps between the semiconductor package 100 and the through interlayer vias 500. As such, the through interlayer vias 500 extend through the encapsulating material 200. The encapsulating material 200 may include a molding compound, an epoxy, or a resin, etc. In some embodiments, a top surface of the encapsulating material 200 may be initially higher than the top ends of the through interlayer vias 500 and the top surface of the semiconductor package 100 (e.g., the top surface of the redistribution structure 140 shown in FIG. 8). Namely, the encapsulating material 200 covers the top ends of the through interlayer vias 500 and the top surface of the semiconductor package 100. Then, a thinning process, which may be a grinding process, is performed to thin the encapsulating material 200 until the top ends of the through interlayer vias 500 and the top surfaces of conductive pads 1442 of the semiconductor package 100 are revealed. Due to the thinning process, the top ends of the through interlayer vias 500 are substantially level with the top surfaces of the encapsulating material 200.

Then, a redistribution structure 300 is formed over the semiconductor package 100 (e.g., the encapsulating material 130 and the redistribution structure 140 shown in FIG. 8) and the encapsulating material 200. The redistribution structure 300 is electrically connected to the semiconductor package 100 and the through interlayer vias 500. In some embodiments, the conductive features of the redistribution structure 300 are electrically connected to the conductive pads 1442 of the semiconductor package 100 and the through interlayer vias 500. In some embodiments, the redistribution structure 300 may also interconnect the conductive pads 1442 and the through interlayer vias 500.

The redistribution structure 300 may be formed by, for example, first depositing a dielectric layer (not individually shown) on the encapsulating material 130, the through interlayer vias 500, and the semiconductor package 100. In some embodiments, the dielectric layer is formed of a photo-sensitive material such as PBO, polyimide, BCB, or the like, which may be patterned using a lithography mask. The dielectric layer may be formed by spin coating, lamination, CVD, the like, or a combination thereof. The dielectric layer is then patterned to form openings exposing portions of the through interlayer vias 500 and/or the conductive pads 1442 of the semiconductor package 100. The patterning may be by an acceptable process, such as by exposing and developing the dielectric layer to light when the dielectric layer is a photo-sensitive material or by etching using, for example, an anisotropic etch.

A metallization pattern is then formed over the dielectric layer. The metallization pattern includes conductive elements extending along the major surface of the dielectric layer and extending through the dielectric layer to physically and electrically couple to the through interlayer vias 500 and/or the conductive pads 1442 of the semiconductor package 100. As an example to form the metallization pattern 126, a seed layer is formed over the dielectric layer and in the openings extending through the dielectric layer. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to a desired metallization pattern. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. This process may be repeated one or more times to form the redistribution structure 300. In some embodiments, a single/dual damascene process may be used.

Still referring to FIG. 9, in some embodiments, a plurality of electrical connectors 310 are disposed on the redistribution structure 300 in accordance with some exemplary embodiments. In some embodiments, the plurality of electrical connectors 310 may include an Under Bump Metallurgy (UBM) layer formed on the redistribution structure 300 by sputtering, evaporation, or electroless plating, etc. The formation of the electrical connectors 310 may include placing solder balls on the redistribution structure 300 (or on the UBM layer), and then reflowing the solder balls. In alternative embodiments, the formation of the electrical connectors 310 may include performing a plating process to form solder regions on the redistribution structure 300, and then reflowing the solder regions. The electrical connector 310 may also include conductive pillars, or conductive pillars with solder caps, which may also be formed through plating. In some embodiments, at least one Integrated Passive Device (IPD) may also be disposed on the redistribution structure 300. The IPD may be fabricated using standard wafer fabrication technologies such as thin film and photolithography processing, and may be mounted on the redistribution structure 300 through, for example, flip-chip bonding or wire bonding, etc.

With now reference to FIG. 9 and FIG. 10, the carrier C1 may be removed. In some embodiments, the carrier C1 is detached from the overlying structure (hereinafter, package structure PK) by causing the adhesive layer AD to lose or reduce adhesion. The adhesive layer AD is then removed along with the carrier C1. For example, the adhesive layer AD may be exposed to UV light, so that the adhesive layer AD loses or reduces adhesion, and hence the carrier C1 and the adhesive layer AD can be removed from the package structure PK. After the carrier C1 is removed, the bottom ends of the through interlayer vias 500 are revealed. In the illustrated structure, the bottom ends of the through interlayer vias 500 are level with the bottom surface of the semiconductor package 100 and the bottom surface of the encapsulating material 200. In the embodiments of the dielectric layer 400 being omitted, a grinding process may be optionally performed to lightly grind the back surface of the semiconductor package 100 (e.g., the back surface of the first die 110) and the bottom ends of the through interlayer vias 500.

In the embodiments having the dielectric layer 400, a patterning process may then be performed on the dielectric layer 400 to form a plurality of openings. The openings are located on the through vias 500 respectively to reveal the bottom ends of the through vias 500. In some embodiments, the openings may be formed by photolithography process, laser drilling process, etc.

Still referring to FIG. 10, a plurality of electrical terminals 610 may be formed over the package structure PK to be electrically connected to the through interlayer vias 500. In some embodiments, the electrical terminals 610 are disposed in the openings of the dielectric layer 400 to be connected to the through vias 500. Then, another package structure 600 is disposed on the package structure PK and is electrically connected to the through interlayer vias 500 through the electrical terminals 610. The package structure 600 is mounted on the package structure PK. Accordingly, the resulting structure is a package-on-package structure 600 as shown in FIG. 10. In some embodiments, the package structure 600 may be packages, device dies, passive devices, and/or the like. In some embodiments, the package-on-package structure 600 may combine vertically discrete memory and logic packages, but the disclosure is not limited thereto. In some embodiments, the bonding between the package structure PK and the package structure 600 may be performed using flip chip bonding through the electrical terminals 610, which may include solder, for example. In some embodiments, an underfill 620 may be formed between the package structure PK and the package structure 600 to encapsulate the electrical terminals 610.

It is appreciated that the device dies in the package structure 600 may be arranged differently than in the illustrated exemplary embodiments. In some embodiments, the device dies are encapsulated by the encapsulating material. Then, the wafer-level package may then be sawed into a plurality of package on package structures 10 independent from one another, with each of the package on package structures 10 including one package structure 600 bonded to one package structure PK.

FIG. 12 to FIG. 16 illustrate schematic top views of various alignment marks according to some embodiments of the present disclosure. Owing to the alignment marks 126 are formed by different process in separated steps from the through vias 124, the design of the alignment marks 126 may be more flexible. For example, a cross-sectional shape of one of the alignment marks 126 can be different from a cross sectional shape (e.g., circular shape) of one of through vias 124 (illustrated in FIG. 8). FIG. 12 to FIG. 16 merely illustrates some of the possible embodiments of the alignment marks 126, but the disclosure is not limited thereto.

Referring firstly to FIG. 12, in one embodiment, from a top view, each of the alignment marks 126a may be in rectangular shape. That is, each of the alignment marks 126a may be a rectangular bar. For example, a width of one of the alignment marks 126a may be about 4 μm to 6 μm (e.g., 5 μm), while a length of one of the alignment marks 126a may be about 12 μm to 14 μm (e.g., 13.5 μm). In one embodiment, the alignment marks 126a may include two groups of alignment marks 1261a, 1262a, and a length direction the alignment marks 1261a is substantially perpendicular to a length direction the alignment marks 1262a, and the alignment marks 1261a, 1262a may be disposed in an alternate manner as shown in FIG. 12. In one embodiment, an overall length of the alignment marks 126 (including the alignment marks 1261a, 1262a) is in a range from about 50 μm to about 70 μm (e.g., 60 μm), and an overall width of the alignment marks 126 (including the alignment marks 1261a, 1262a) is in a range from about 50 μm to about 70 μm (e.g., 60 μm), but the disclosure is not limited thereto.

With reference to FIG. 13, in some embodiments, from a top view, the alignment marks 126b may be rectangular (e.g., square) rings arranged in concentric manner. For example, the alignment marks 126b may include a first alignment mark 1261b and a second alignment mark 1262b located within the first alignment mark 1261b as shown in FIG. 13. In some embodiments, a width/length of the first alignment mark 1261b may be in a range from about 4 μm to about 6 μm (e.g., 5 μm) while a width/length of the second alignment mark 1262b may be in a range from about 2 μm to about 3 μm (e.g., 2.5 μm). In one embodiment, a width/length of the alignment marks 126b may be in a range from about 50 μm to about 70 μm (e.g., 60 μm), but the disclosure is not limited thereto.

With reference to FIG. 14, in some embodiments, the shapes of the alignment marks 126c may be vary. For example, the alignment marks 126c may include two groups of alignment marks 1261c, 1262c, and the cross section shape of each of the alignment marks 1261c is in circular shape while the cross section shape of each of the alignment marks 1262c is in rectangular shape. The alignment marks 1261c, 1262c may be disposed in an alternate manner as shown in FIG. 14. In some embodiments, a width of the rectangular alignment mark 1262c may be about 4 μm to 6 μm (e.g., 5 μm), while a length of the rectangular alignment mark 1262c may be about 12 μm to 15 μm (e.g., 13.5 μm). Some of the circular alignment marks 1261c are arranged along a length direction of the rectangular alignment mark 1262c. In some embodiments, an overall length/width of the alignment marks 126c (including the alignment marks 1261c, 1262c) may be in a range from about 50 μm to about 70 μm (e.g., 60 μm), but the disclosure is not limited thereto.

Figure 15:
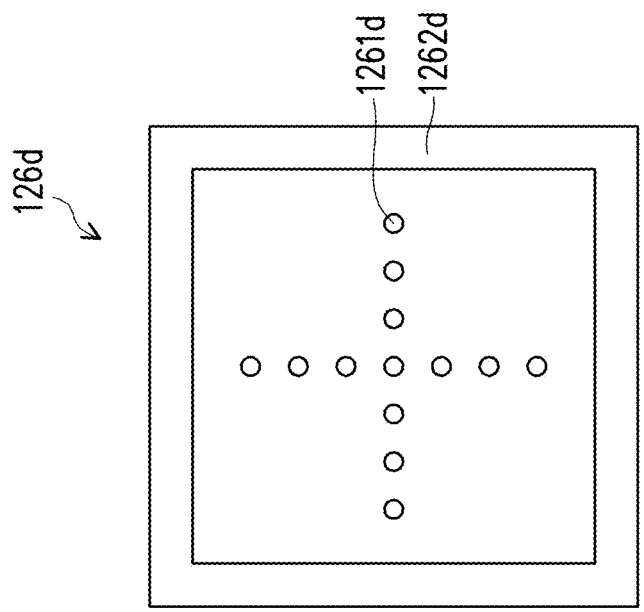

With reference to FIG. 15, in some embodiments, the shapes of the alignment marks 126d may be vary. For example, the alignment marks 126c may include two types of alignment marks 1261d, 1262d, and, from a top view, the alignment mark 1262d may be a rectangular (e.g., square) ring that defines a closed region, and the alignment marks 1261d are disposed in the closed region. In some embodiments, the alignment marks 1261d may be a plurality of through vias arranged as a cross pattern within the closed region defined by the alignment mark 1262d as shown in FIG. 15. In some embodiments, an overall width/length of the alignment marks 126d may be in a range from about 50 μm to about 70 μm (e.g., 60 μm), but the disclosure is not limited thereto.

Figure 16:
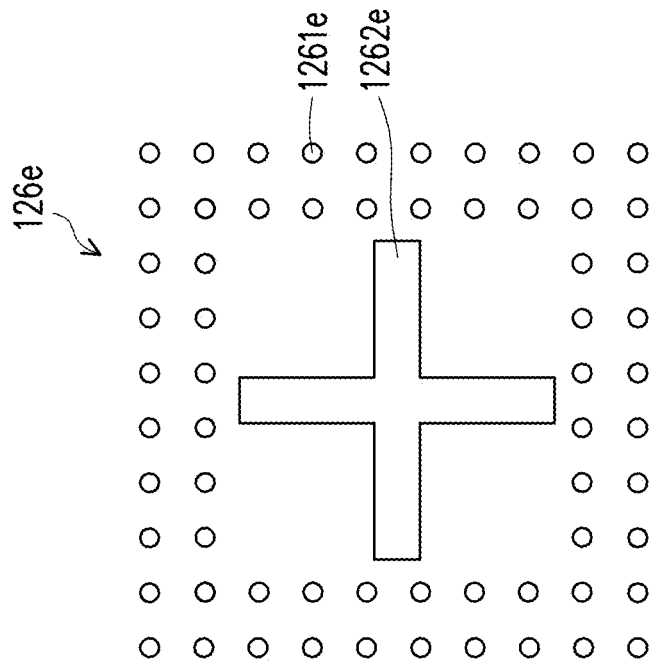

With reference to FIG. 16, in some embodiments, the alignment marks 126e may include two types of alignment marks 1261e, 1262e, and the alignment marks 1261e are a plurality of through vias surrounding a region where the alignment mark 1262e is disposed. In some embodiments, the alignment marks 1261e may surround a rectangular (e.g., square) region, and the alignment mark 1262e disposed within the rectangular region is in a cross shape. In some embodiments, a width of the cross-shaped alignment mark 1262e may be about 2 μm to 3 μm (e.g., 2.5 μm), while a length of the cross-shaped alignment mark 1262e may be in a range from about 8 μm to about 12 μm (e.g., 10 μm). In some embodiments, an overall width/length of the alignment mark 126e is in a range from about 50 μm to about 70 μm (e.g., 60 μm), but the disclosure is not limited thereto. It is noted that the dimensions and numbers mentioned in the embodiments regarding FIG. 12 to FIG. 16 are merely for illustration purposes, not for limiting the disclosure.

Figure 17:
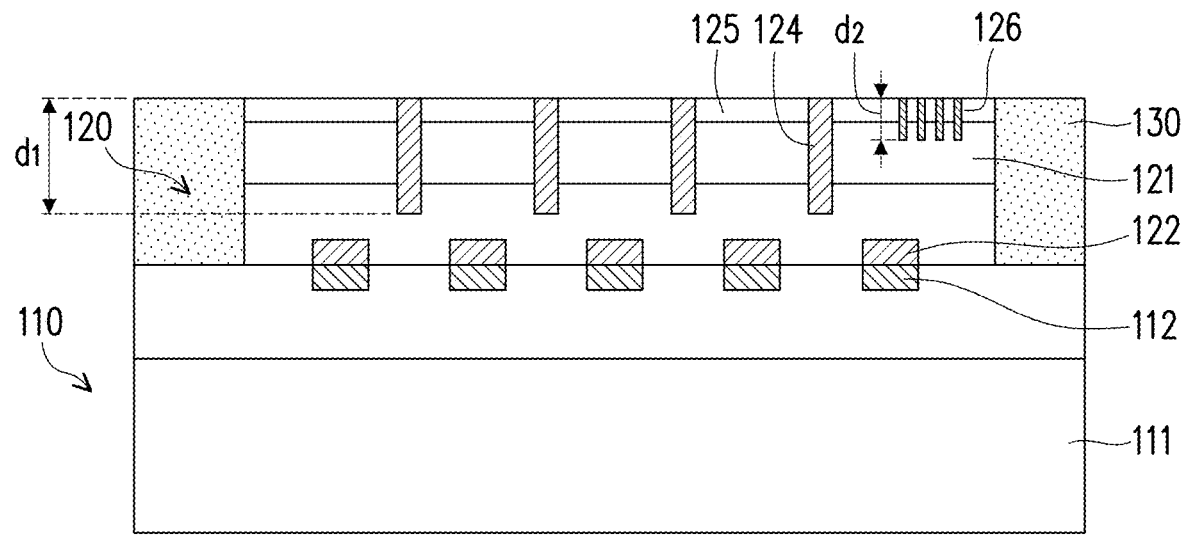
FIG. 17 illustrates a schematic cross sectional view of an intermediate stage in the manufacturing of a semiconductor package according to some embodiments of the present disclosure.

FIG. 17 illustrates a schematic cross sectional view of an intermediate stage in the manufacturing of a semiconductor package according to some embodiments of the present disclosure. It is noted that the semiconductor package shown in FIG. 17 contains many features same as or similar to the semiconductor package disclosed in the previous embodiments (e.g., the semiconductor package shown in FIG. 6). For purpose of clarity and simplicity, detail description of same or similar features may be omitted, and the same or similar reference numbers denote the same or like components.

Referring to FIG. 17, in accordance with some embodiments of the disclosure, a depth d2 of each of the alignment marks 126 is different from a depth d1 of each of the through vias 124. In some embodiments, the depth d2 of each of the alignment marks 126 is substantially smaller than the depth d1 of each of the through vias 124. In embodiments such as that illustrated in FIG. 6, the alignment marks 126 extend through the isolation layer 125. In some embodiments, the alignment marks 126 further extend into the substrate 121 of the second die 120, but do not extend all the way through the substrate 121 of the second die 120 as illustrated in FIG. 17. That is, the depth d2 of each of the alignment marks 126 is greater than the thickness of the isolation layer 125.

Figure 18:
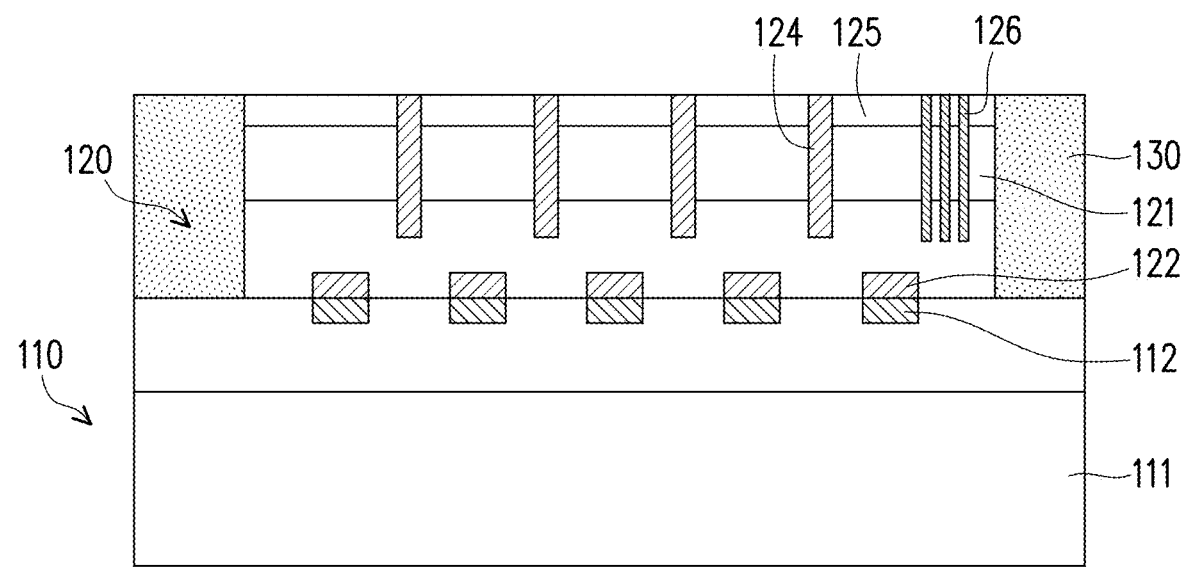
FIG. 18 illustrates a schematic cross sectional view of an intermediate stage in the manufacturing of a semiconductor package according to some embodiments of the present disclosure.

FIG. 18 illustrates a schematic cross sectional view of an intermediate stage in the manufacturing of a semiconductor package according to some embodiments of the present disclosure. It is noted that the semiconductor package shown in FIG. 18 contains many features same as or similar to the semiconductor package disclosed in the previous embodiments (e.g., the semiconductor package shown in FIG. 6). For purpose of clarity and simplicity, detail description of same or similar features may be omitted, and the same or similar reference numbers denote the same or like components.

Referring to FIG. 18, in accordance with some embodiments of the disclosure, the depth of each of the alignment marks 126 may be about the same as the depth of each of the through vias 124. In some embodiments, the alignment marks 126 may extend through the isolation layer 125 and the substrate 121 of the second die 120 and may further extend into the interconnection structure 123, but the alignment marks 126 are not electrically connected to the integrated circuit device (e.g., the integrated circuit device 1231 shown in FIG. 1) in the interconnection structure 123. That is, the depth of the alignment mark 126 is greater than the sum of the thickness of the isolation layer 125 and the thickness of the substrate 121, and may be substantially equal to the depth of each of the through vias 124.

In some embodiments, the depths of the alignment marks 126 may be about the same as the depths of the through vias 124 while the pitches of the alignment mark 126 are different from pitches of the through vias 124.

Figure 19:
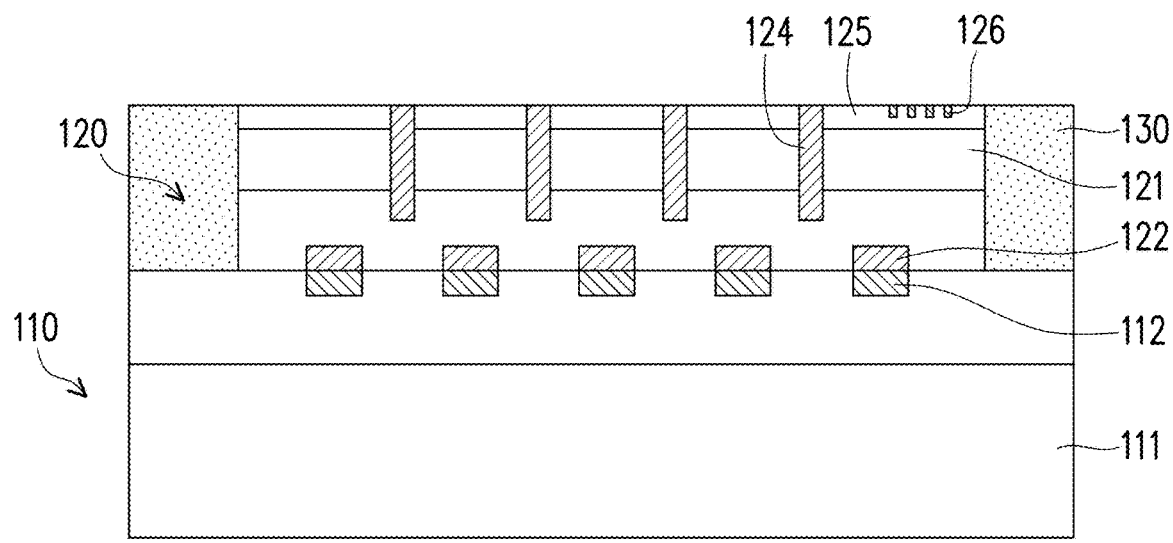
FIG. 19 illustrates a schematic cross sectional view of an intermediate stage in the manufacturing of a semiconductor package according to some embodiments of the present disclosure.

FIG. 19 illustrates a schematic cross sectional view of an intermediate stage in the manufacturing of a semiconductor package according to some embodiments of the present disclosure. It is noted that the semiconductor package shown in FIG. 19 contains many features same as or similar to the semiconductor package disclosed in the previous embodiments (e.g., the semiconductor package shown in FIG. 6). For purpose of clarity and simplicity, detail description of same or similar features may be omitted, and the same or similar reference numbers denote the same or like components.

Referring to FIG. 19, in accordance with some embodiments of the disclosure, the depth of each of the alignment marks 126 is different from a depth d1 of each of the through vias 124. In some embodiments, the depth of each of the alignment marks 126 is less than the depth of each of the through vias 124. In some embodiments, the alignment marks 126 extend from the upper surface of the isolation later 125, but not all the way through the isolation layer 125. That is, the depth of the alignment mark 126 is less than the thickness of the isolation layer 125.

Figure 20:
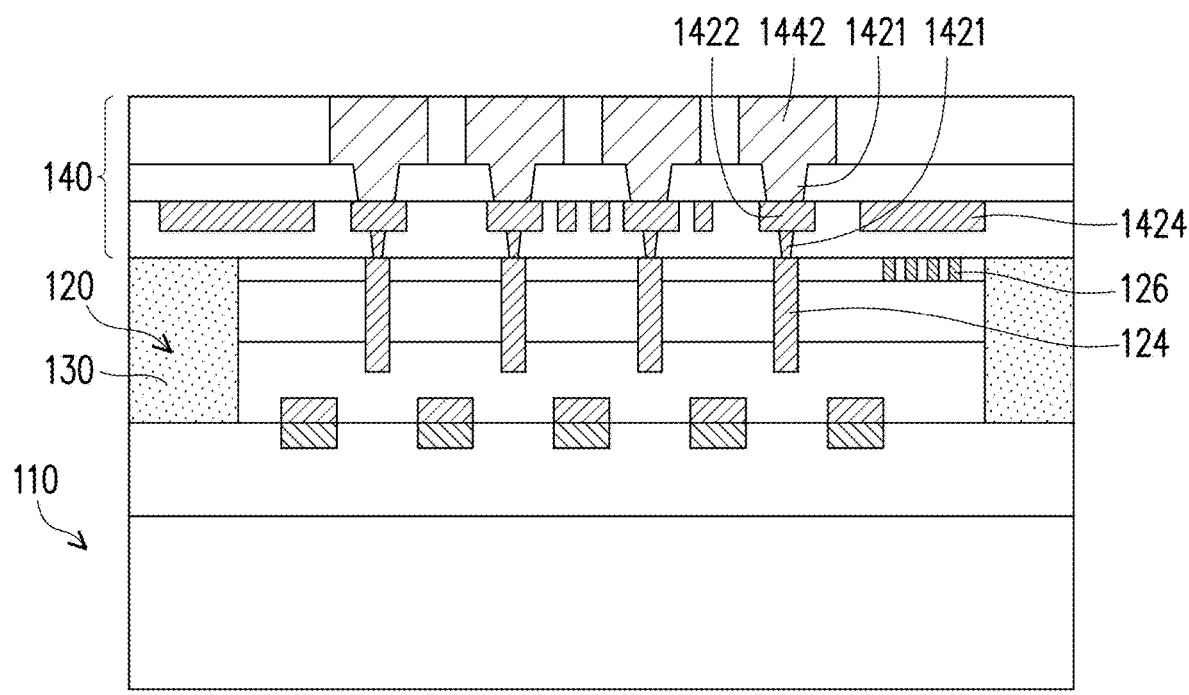
FIG. 20 illustrates a schematic cross sectional view of a semiconductor package according to some embodiments of the present disclosure.

FIG. 20 illustrates a schematic cross sectional view of a semiconductor package according to some embodiments of the present disclosure. It is noted that the semiconductor package shown in FIG. 20 contains many features same as or similar to the semiconductor package disclosed in the previous embodiments. For purpose of clarity and simplicity, detail description of same or similar features may be omitted, and the same or similar reference numbers denote the same or like components.

Referring to FIG. 20, in accordance with some embodiments of the disclosure, at least one of the conductive layers of the redistribution structure 140 includes an alignment pattern 1424 that overlaps with the alignment marks 126 from a top view. In some embodiments, the conductive layer including the redistribution layer 1422 may also include the alignment pattern 1424. That is, the alignment pattern 1424 is at the same level (layer) with the redistribution layer 1422 and may be formed with the redistribution layer 1422 in the same step (simultaneously). In some embodiments, the alignment pattern 1424 is aligned with the alignment marks 126 from a top view, which allows for identification of a proper orientation of the redistribution structure 140. In some embodiments, the alignment pattern 1424 is electrically insulated from the redistribution layer 1422. In some embodiments, the alignment pattern 1424 may have the same pattern as the alignment marks 126. In some embodiments, the alignment pattern 1424 may have a pattern different from the alignment marks 126.

Figure 21:
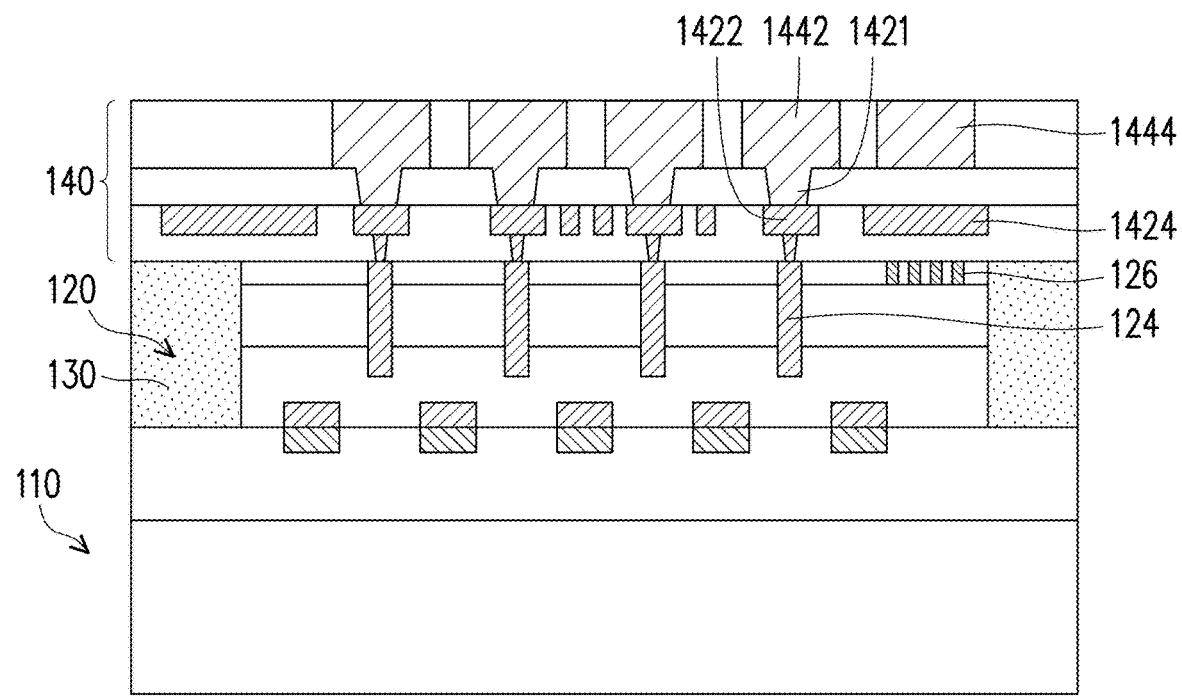
FIG. 21 illustrates a schematic cross sectional view of a semiconductor package according to some embodiments of the present disclosure.

FIG. 21 illustrates a schematic cross sectional view of a semiconductor package according to some embodiments of the present disclosure. It is noted that the semiconductor package shown in FIG. 21 contains many features same as or similar to the semiconductor package disclosed in the previous embodiments. For purpose of clarity and simplicity, detail description of same or similar features may be omitted, and the same or similar reference numbers denote the same or like components.

Referring to FIG. 21, in accordance with some embodiments of the disclosure, at least one of the conductive layers of the redistribution structure 140 includes an alignment pattern that overlaps with the alignment marks 126 from a top view. In some embodiments, in addition to the alignment pattern 1424 described above, the conductive layer including the redistribution layer (or conductive pads) 1442 may further include the alignment pattern 1444 that overlaps with the alignment marks 126 from a top view. That is, in such embodiment, the redistribution structure 140 includes the alignment pattern 1424 that is at the same level (layer) with the redistribution layer 1422, and the alignment pattern 1444 that is at the same level (layer) with the conductive pads 1442. In some embodiments, the alignment pattern 1424 and the alignment pattern 1444 are aligned with the alignment marks 126 from a top view respectively, which allow for identification of a proper orientation of the redistribution structure 140. In some embodiments, the alignment pattern 1424 is electrically insulated from the redistribution layer 1422 while the alignment pattern 1444 is electrically insulated from the conductive pads 1442. In some embodiments, the alignment patterns 1424 and 1444 may each have the same pattern as the alignment marks 126. In some embodiments, the alignment patterns 1424 and 1444 may each have pattern different from the alignment marks 126.

Figure 22:
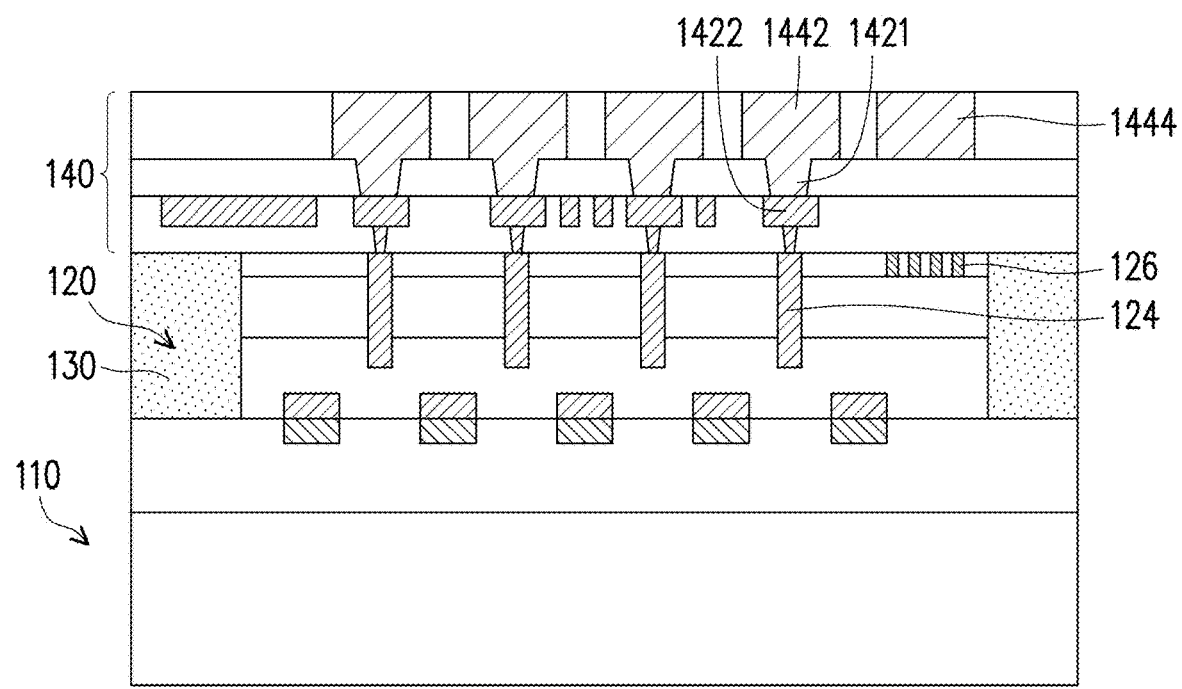
FIG. 22 illustrates a schematic cross sectional view of a semiconductor package according to some embodiments of the present disclosure.

FIG. 22 illustrates a schematic cross sectional view of a semiconductor package according to some embodiments of the present disclosure. It is noted that the semiconductor package shown in FIG. 22 contains many features same as or similar to the semiconductor package disclosed in the previous embodiments. For purpose of clarity and simplicity, detail description of same or similar features may be omitted, and the same or similar reference numbers denote the same or like components.

Referring to FIG. 22, in accordance with some embodiments of the disclosure, at least one of the conductive layers of the redistribution structure 140 includes an alignment pattern that overlaps with the alignment marks 126 from a top view. In some embodiments, the conductive layer including the redistribution layer (or conductive pads) 1442 may further include the alignment pattern 1444. That is, the alignment pattern 1444 is at the same level (layer) with the conductive pads 1442 and may be formed with the conductive pads 1442 in the same step (simultaneously). In some embodiments, the alignment pattern 1444 is aligned with the alignment marks 126 from a top view, which allows for identification of a proper orientation of the redistribution structure 140. In some embodiments, the conductive layer including the redistribution layer 1422 does not overlap with the alignment marks 126 from a top view. That is, the conductive layer including the redistribution layer 1422 does not have any alignment pattern aligned with the alignment marks 126. In some embodiments, the alignment pattern 1444 is electrically insulated from the conductive pads 1442. In some embodiments, the alignment pattern 1444 may have the same pattern as the alignment marks 126. In some embodiments, the alignment pattern 1444 may have a pattern different from the alignment marks 126.

Figure 23:
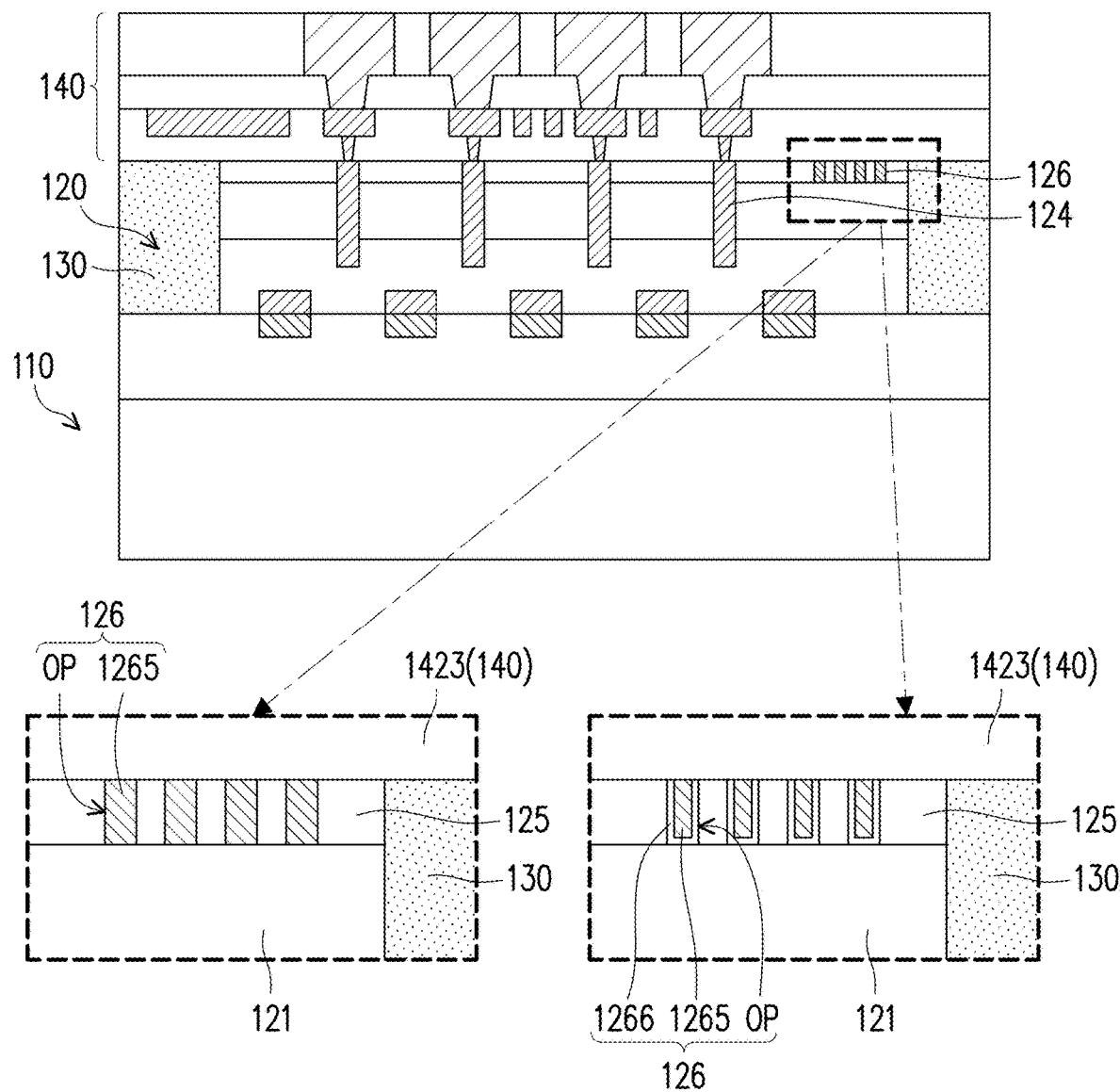
FIG. 23 illustrates a schematic cross sectional view and partial enlarged views of a semiconductor package according to some embodiments of the present disclosure.

FIG. 23 illustrates a schematic cross sectional view and partial enlarged views of a semiconductor package according to some embodiments of the present disclosure. It is noted that the semiconductor package shown in FIG. 23 contains many features same as or similar to the semiconductor package disclosed in the previous embodiments. For purpose of clarity and simplicity, detail description of same or similar features may be omitted, and the same or similar reference numbers denote the same or like components.

With reference to FIG. 23, in some embodiments, the material filling in the openings OP of the alignment marks 126 may be a composite layer. That is, the alignment marks 126 may include a plurality of layers filling the openings OP of the alignment marks 126. In some embodiments, the alignment marks 126 may include a barrier layer 1266, such as a titanium nitride (TiN) layer, covering the sidewalls of the openings OP, and a conductive layer 1265, such as a copper (Cu) layer, filling the remaining portion of the openings OP. In some embodiments, the formation of the alignment marks 126 may include the following steps. First, a plurality of openings OP are formed by the etching process through a mask layer (e.g., the mask layer PR shown in FIG. 5) over the top surface of the second die 120 (e.g., the isolation layer 125). Accordingly, the pattern of the mask layer PR is transferred to the isolation layer 125 (and may be the substrate 121 of the second die 120) by the etching process. Then, the barrier layer 1266 may be formed over the isolation layer 125 and cover the sidewall of the openings OP. In some embodiments, the barrier layer 1266 may be formed from materials including TaN, TiN, or the like. The barrier layer 1266 may have a thickness ranging from about 500 angstroms to about 750 angstroms. The barrier layer 1266 may be formed by using various deposition techniques such as ALD, PVD, CVD, or other suitable techniques.

Then, the conductive layer 1265 may be formed over the barrier layer 1266 to fill the remaining portion of the openings OP. For example, the conductive layer 1265 may include conductive material, such as copper, tungsten, other conductive metals, or the like, and may be formed, for example, by electroplating, electroless plating, or the like. The conductive layer 1265 may have a thickness ranging from about 1 μm to about 2 μm. The conductive material of the alignment marks 126 may be the same as that of the through vias 124. In some embodiments, the conductive material of the alignment marks 126 may be different from the conductive material of the through vias 124 since they are formed by different processes in separate steps. Then, the mask layer may be removed using a suitable removal process, such as an ashing process. Thereafter, a planarization process such as a CMP process may be performed to remove excess portions of the conductive layer 1265 and the barrier layer 1266 until the isolation layer 125 is exposed. The use of a composite layer is shown in the context of the alignment marks of FIG. 23 for illustrative purposes. In some embodiments, the composite layer shown in FIG. 23 may be used in other alignment mark configurations, including those discussed above with reference to FIGS. 17-19.

Figure 24:
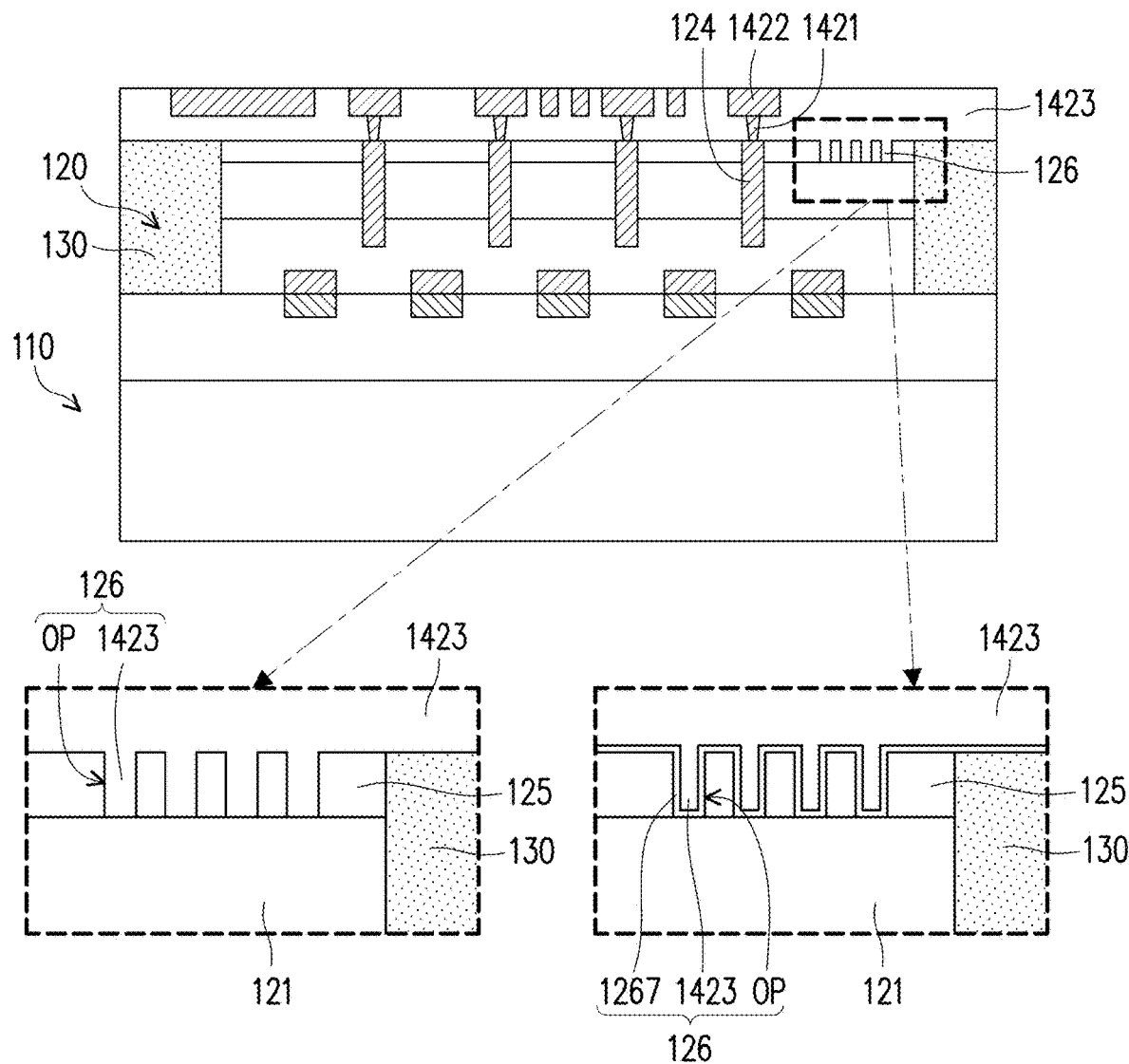
FIG. 24 illustrates a schematic cross sectional view and partial enlarged views of a semiconductor package according to some embodiments of the present disclosure.

FIG. 24 illustrates a schematic cross sectional view and partial enlarged views of a semiconductor package according to some embodiments of the present disclosure. It is noted that the semiconductor package shown in FIG. 24 contains many features same as or similar to the semiconductor package disclosed in the previous embodiments. For purpose of clarity and simplicity, detail description of same or similar features may be omitted, and the same or similar reference numbers denote the same or like components.

With reference to FIG. 24, in accordance with some embodiments of the disclosure, the material filling in the openings OP of the alignment marks 126 may be a dielectric material. In some embodiments, the dielectric material of the redistribution structure 140 fills the openings OP of the alignment marks 126. For example, the dielectric layer 1423 may fills the openings OP to form the alignment marks 126 as it is shown in the partial enlarged view on the left in FIG. 24. The dielectric material of the redistribution structure 140 may include silicon nitride (SiN), HDP OX(SiO$_2$), TEOS OX(SiO$_2$), silicon oxide, silicon carbide (SiC), silicon oxycarbide (SiOC), silicon oxynitride (SiON), oxygen-doped silicon carbide, nitrogen-doped silicon carbide, USG, or the like. It is noted that the dielectric material filling in the openings OP is different from the material of the isolation layer 125. In some embodiments, the formation of the alignment marks 126 may include the following steps. First, a plurality of openings OP is formed by the etching process through a mask layer (e.g., the mask layer PR shown in FIG. 5) over the top surface of the second die 120 (e.g., the isolation layer 125). Accordingly, the pattern of the mask layer PR is transferred to the isolation layer 125 (and may be the substrate 121 of the second die 120) by the etching process. The mask layer may then be removed using a suitable removal process, such as an ashing process. Then, the dielectric layer 1423 may be formed over the second die 120 and the encapsulating material 130 to cover the top surfaces of the second die 120 (e.g., the isolation layer 125) and the encapsulating material 130 and fills the openings OP to form the alignment marks 126. The dielectric layer 1423 may be formed by a suitable deposition process such as CVD, or the like.

In some embodiments, the dielectric material filling in the openings OP of the alignment marks 126 may be a composite layer. That is, a plurality of dielectric layers may fill in the openings OP of the alignment marks 126 as it is shown in the partial enlarged view on the right in FIG. 24. In some embodiments, the alignment marks 126 may include a water resisting layer 1267, such as a silicon nitride (SiN) layer, covering the sidewalls of the openings OP, and the dielectric material (e.g., dielectric layer 1423) of the redistribution structure 140 filling the remaining portion of the openings OP. In some embodiments, the water resisting layer 1267 may cover the entire top surface of the second die (e.g., the top surface the isolation layer 125 and the sidewalls of the openings OP) and the top surface of the encapsulating material 130 to provide water resisting property to the second die 120 and the encapsulating material 130. For example, the water resisting layer 1267 may have a thickness ranging between about 500 angstrom to about 750 angstrom. The water resisting layer 1267 may be formed by a CVD technique. The dielectric material of the redistribution structure 140 may include a silicon oxide (SiO$_x$) layer, or the like. The silicon oxide layer may include tetraethoxysilane (TEOS) or silica glass. The silicon oxide layer may have a thickness ranging between about 1 μm to about 2 μm. It is noted that the dielectric material filling in the openings OP may be different from the material of the isolation layer 125. In some embodiments, the formation of the alignment marks 126 may include the following steps. First, a plurality of openings OP are formed by the etching process through a mask layer (e.g., the mask layer PR shown in FIG. 5) over the top surface of the second die 120 (e.g., the isolation layer 125). Accordingly, the pattern of the mask layer PR is transferred to the isolation layer 125 (and may be the substrate 121 of the second die 120) by the etching process. The mask layer may then be removed using a suitable removal process, such as an ashing process. Then, the water resisting layer 1267 may be formed over the top surface of the isolation layer 125 (and the top surface of the encapsulating material 130) and cover the sidewall of the openings OP.

In some embodiments, the water resisting layer 1267 may be formed from materials including silicon nitride (SiN), or the like. The water resisting layer 1267 may have a thickness ranging from about 500 angstroms to about 750 angstroms. The water resisting layer 1267 may be formed by using various deposition techniques such as ALD, PVD, CVD, or other suitable techniques. Then, the dielectric layer 1423 may be formed over the second die 120 and the encapsulating material 130 to cover the top surfaces of the second die 120 (e.g., the isolation layer 125) and the encapsulating material 130 and fills the remaining portion of the openings OP to form the alignment marks 126. The dielectric layer 1423 may be formed by a suitable deposition process such as CVD, or the like.

Figure 25:
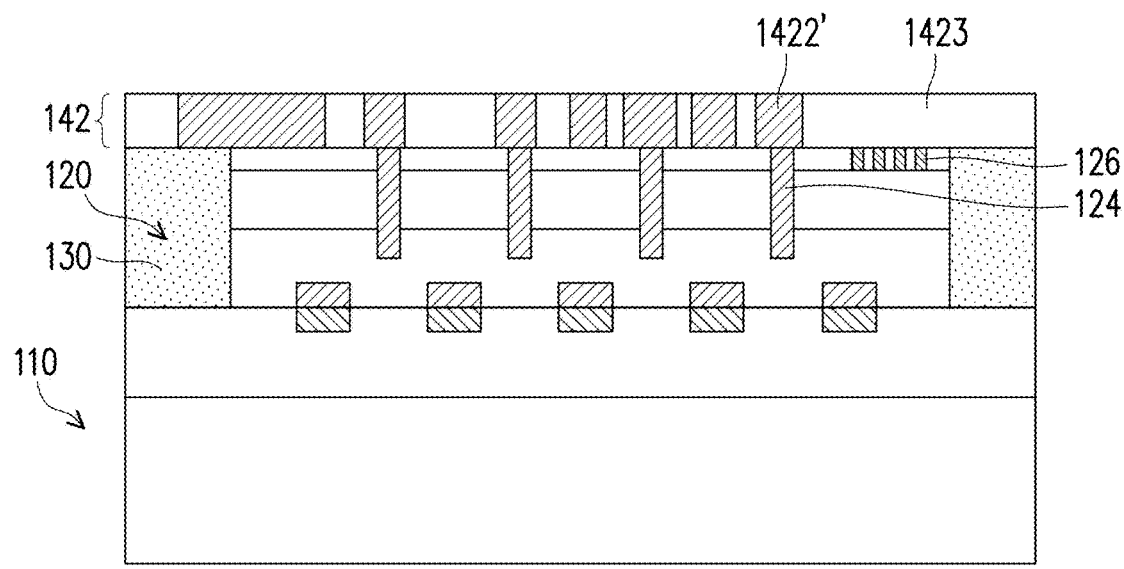
FIG. 25 to FIG. 26 illustrate cross sectional views of intermediate stages in the manufacturing of a semiconductor package according to some embodiments of the present disclosure.
Figure 26:
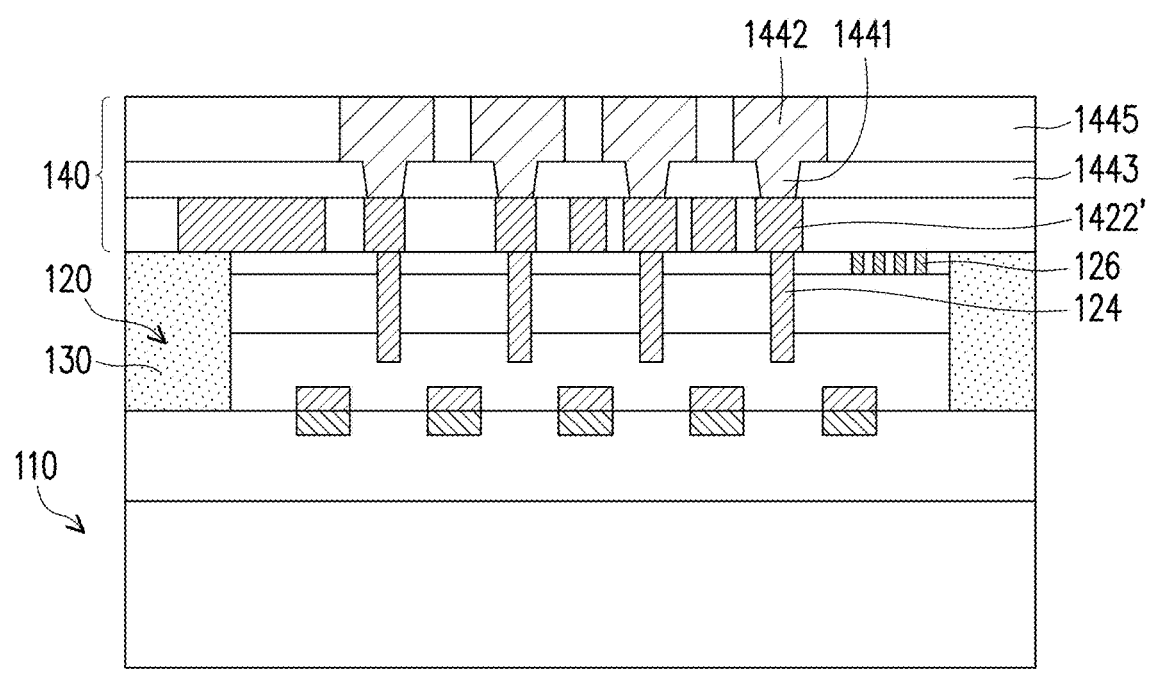

FIG. 25 to FIG. 26 illustrate cross sectional views of intermediate stages in the manufacturing of a semiconductor package according to some embodiments of the present disclosure. It is noted that the manufacturing method and the semiconductor package shown in FIG. 25 to FIG. 26 contains many features same as or similar to the semiconductor package disclosed in the previous embodiments. For purpose of clarity and simplicity, detail description of same or similar features may be omitted, and the same or similar reference numbers denote the same or like components.

Referring to FIG. 25, in some embodiments, a redistribution layer 1422' may be in contact with the through vias 124 without through dielectric vias (e.g., the through dielectric vias 1421 shown in FIG. 24) connecting in between. For example, the dielectric layer 1423 may be formed over the second die 120 and the encapsulating material 130 to cover the top surfaces of the second die 120 (e.g., the isolation layer 125) and the encapsulating material 130. The dielectric layer 1423 may include an oxide such as silicon oxide, a nitride such as silicon nitride, USG, or the like, or combinations thereof. The dielectric layer 1423 may be formed by a suitable deposition process such as CVD. Then, the redistribution layer (traces) 1422' is formed in the dielectric layer 1423 through, for example, a damascene process. In some embodiments, the alignment marks 126 do not overlap with the redistribution layer (traces) 1422' from a top view, so the alignment marks 126 would not be block during the alignment process. However, the disclosure is not limited thereto.

In some embodiments, a patterning process is performed to form a plurality of trenches in the dielectric layer 1423. In some embodiments, the trenches extend through the dielectric layer 1423. The patterning process removes a portion of the dielectric layer 1423 to expose the top surfaces of the through vias 124 of the second die 120. The pattering process may include multiple photolithograph and/or etching processes. The sidewalls of the trenches may be straight or inclined. Then, the trenches are filled with conductive material to form the redistribution layer 1422' shown in FIG. 25. The conductive material includes a suitable metallic material, such as copper or copper alloy.

In some embodiments, the forming method of the conductive material may include a plating process such as electroplating process or electro-chemical plating, or a suitable deposition process such as CVD, PVD, or the like. Thereafter, a planarization process such as a CMP process may be performed to remove excess portions of the conductive material until the dielectric layer 1423 is exposed. In some embodiments, after the planarization process is performed, the top surfaces of the redistribution layer 1422' are substantially coplanar with the top surface of the dielectric layer 1423.

Then, referring to FIG. 26, in some embodiments, the passivation layer 1443 is formed over the dielectric layer 1423, and the vias 1441 are formed in the passivation layer 1443 to electrically connect to the redistribution layer 1422'. Then, the redistribution layer (or conductive pads) 1442 are formed over the passivation layer 1443 and the vias 1441, and are electrically coupled to redistribution layer 1422'. The material of the redistribution layer (or conductive pads) 1442 and the vias 1441 may respectively include a suitable metallic material, such as aluminum, copper, alloys thereof, or combinations thereof. In some embodiments, the conductive pads 1442 may be aluminum pads or aluminum-copper pads, and other metallic materials may be used. The vias 1441 and the redistribution layer 1442 may be formed separately with an interface therebetween, or formed simultaneously without an interface therebetween. In some embodiments, the alignment marks 126 do not overlap with the redistribution layer 1442 from a top view, so the alignment marks 126 would not be block during the alignment process. However, the disclosure is not limited thereto.

In some embodiments, the passivation layer 1445 may be formed over the passivation layer 1443 to at least laterally encapsulate the conductive pads 1442. The passivation layers 1443 and 1445 may respectively be a single layer or a composite layer, and may be formed of a non-porous material. In some embodiments, each of the passivation layers 1443 and 1445 may include silicon oxide, silicon nitride, or a combination thereof. In some embodiments, one or both of passivation layers 1443 and 1445 is a composite layer including a silicon oxide layer (not shown separately), and a silicon nitride layer (not shown separately) over the silicon oxide layer. The passivation layers 1443 and 1445 may also be formed of other non-porous dielectric materials such as Un-doped Silicate Glass (USG), silicon oxynitride, and/or the like, or combinations thereof. Then, a planarization process such as a CMP process may be performed to remove excess portions of the passivation layer 1445 until the conductive pads 1442 are exposed. In some embodiments, after the planarization process is performed, the top surfaces of the conductive pads 1442 are substantially coplanar with the top surface of the passivation layer 1445.

Figure 27:
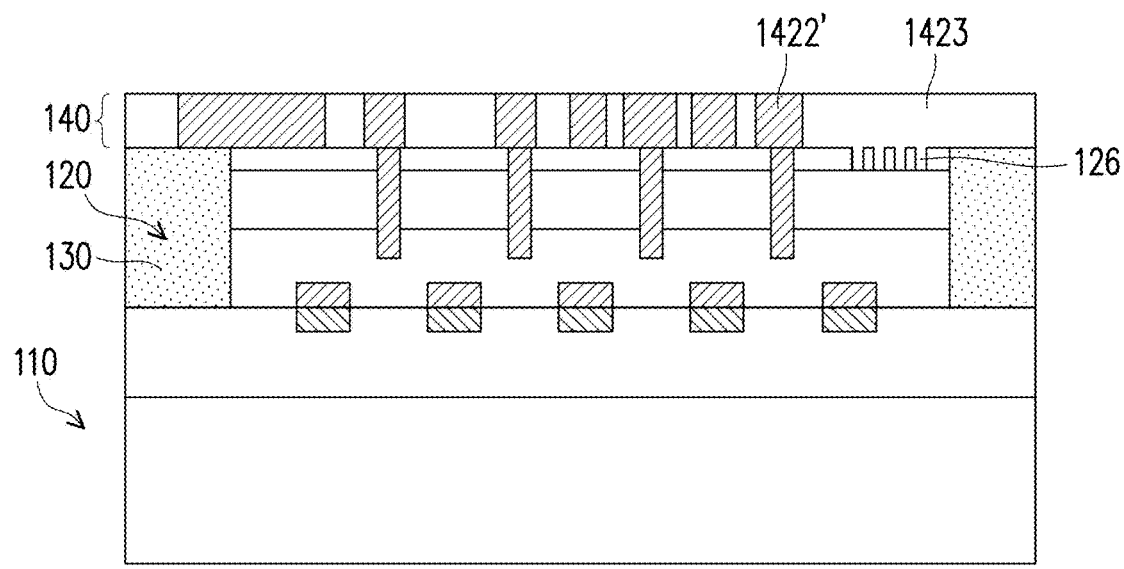
FIG. 27 to FIG. 28 illustrate cross sectional views of intermediate stages in the manufacturing of a semiconductor package according to some embodiments of the present disclosure.
Figure 28:
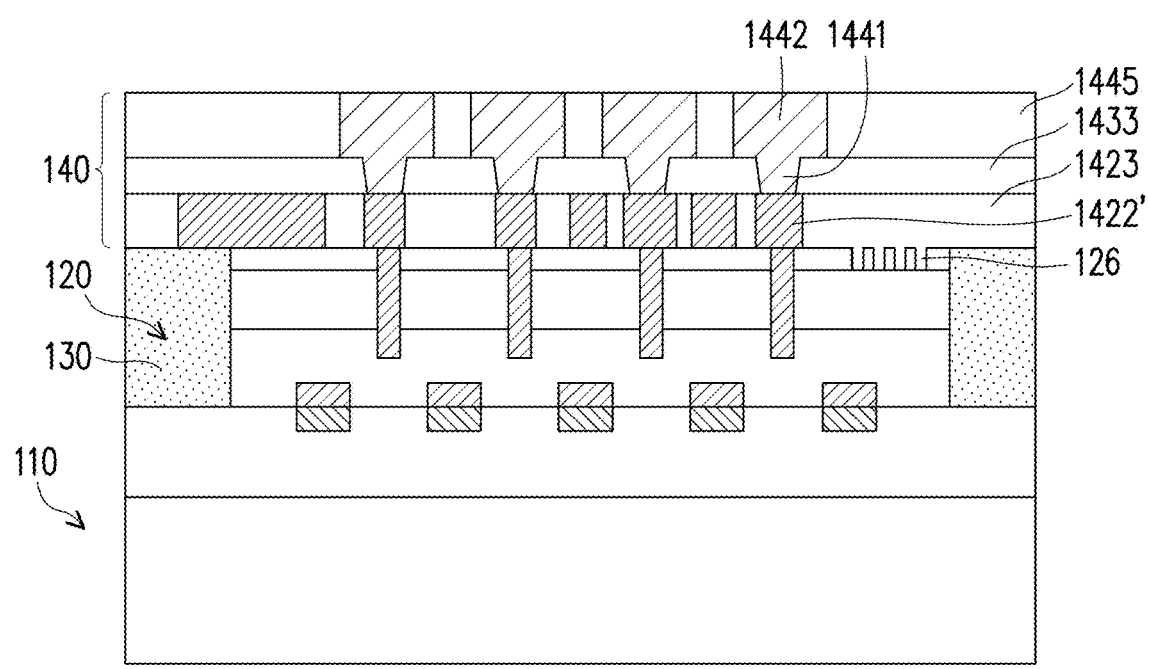

FIG. 27 to FIG. 28 illustrate cross sectional views of intermediate stages in the manufacturing of a semiconductor package according to some embodiments of the present disclosure. It is noted that the manufacturing method and the semiconductor package shown in FIG. 27 to FIG. 28 contains many features same as or similar to the semiconductor package disclosed in the previous embodiments. For purpose of clarity and simplicity, detail description of same or similar features may be omitted, and the same or similar reference numbers denote the same or like components.

Referring to FIG. 27, in accordance with some embodiments of the disclosure, the material filling in the openings OP of the alignment marks 126 may be dielectric material. In some embodiments, the dielectric material of the redistribution structure 140 fills the openings OP of the alignment marks 126. For example, the dielectric layer 1423 may fill the openings OP to form the alignment marks 126 as it is shown in FIG. 27. In addition, in some embodiments, the redistribution layer 1422' may be in (direct) contact with the through vias 124 without through dielectric vias (e.g., the through dielectric vias 1421 shown in FIG. 24) connecting in between. For example, After the openings of the alignment marks 126 are formed by etching process, the dielectric layer 1423 may be formed over the second die 120 and the encapsulating material 130 to cover the top surfaces of the second die 120 (e.g., the isolation layer 125) and the encapsulating material 130, and fills the openings of the alignment marks 126. The dielectric layer 1423 may be formed by a suitable deposition process such as CVD, or the like. Then, the redistribution layer (traces) 1422' is formed in the dielectric layer 1423 through, for example, damascene process. In some embodiments, the alignment marks 126 do not overlap with the redistribution layer (traces) 1422' from a top view, so the alignment marks 126 would not be block during the alignment process. However, the disclosure is not limited thereto. In other embodiments, the redistribution layer (traces) 1422' may further include an alignment pattern that is overlapped (aligned) with the alignment marks 126.

In some embodiments, a patterning process is performed to form a plurality of trenches in the dielectric layer 1423. In some embodiments, the trenches extend through the dielectric layer 1423. Then, the trenches is filled with conductive material to form the redistribution layer 1422' shown in FIG. 27. The conductive material includes a suitable metallic material, such as copper or copper alloy. In some embodiments, the forming method of the conductive material may include a plating process such as electroplating process or electro-chemical plating, or a suitable deposition process such as CVD, PVD, or the like. Thereafter, a planarization process such as a CMP process may be performed to remove excess portions of the conductive material until the dielectric layer 1423 is exposed.

Then, referring to FIG. 28, in some embodiments, the passivation layer 1443 is formed over the dielectric layer 1423, and the vias 1441 are formed in the passivation layer 1443 to electrically connect to the redistribution layer 1422'. Then, the redistribution layer (or conductive pads) 1442 are formed over the passivation layer 1443 and the vias 1441, and are electrically coupled to redistribution layer 1422'. In some embodiments, the alignment marks 126 do not overlap with the redistribution layer 1442 from a top view, so the alignment marks 126 would not be block during the alignment process. However, the disclosure is not limited thereto. In other embodiments, the redistribution layer 1442 may further include an alignment pattern that is overlapped (aligned) with the alignment marks 126.

In some embodiments, the passivation layer 1445 may be formed over the passivation layer 1443 to at least laterally encapsulate the conductive pads 1442. Then, a planarization process such as a CMP process may be performed to remove excess portions of the passivation layer 1445 until the conductive pads 1442 are exposed. In some embodiments, after the planarization process is performed, the top surfaces of the conductive pads 1442 are substantially coplanar, within process variations, with the top surface of the passivation layer 1445. The disclosure does not limit the process and step orders of manufacturing the redistribution structure 140.

FIG. 29 to FIG. 32 illustrate cross sectional views of intermediate stages in the manufacturing of a semiconductor package according to some embodiments of the present disclosure. It is noted that the manufacturing method and the semiconductor package shown in FIG. 29 to FIG. 32 contains many features same as or similar to the semiconductor package disclosed in the previous embodiments. For purpose of clarity and simplicity, detail description of same or similar features may be omitted, and the same or similar reference numbers denote the same or like components.

Figure 29:
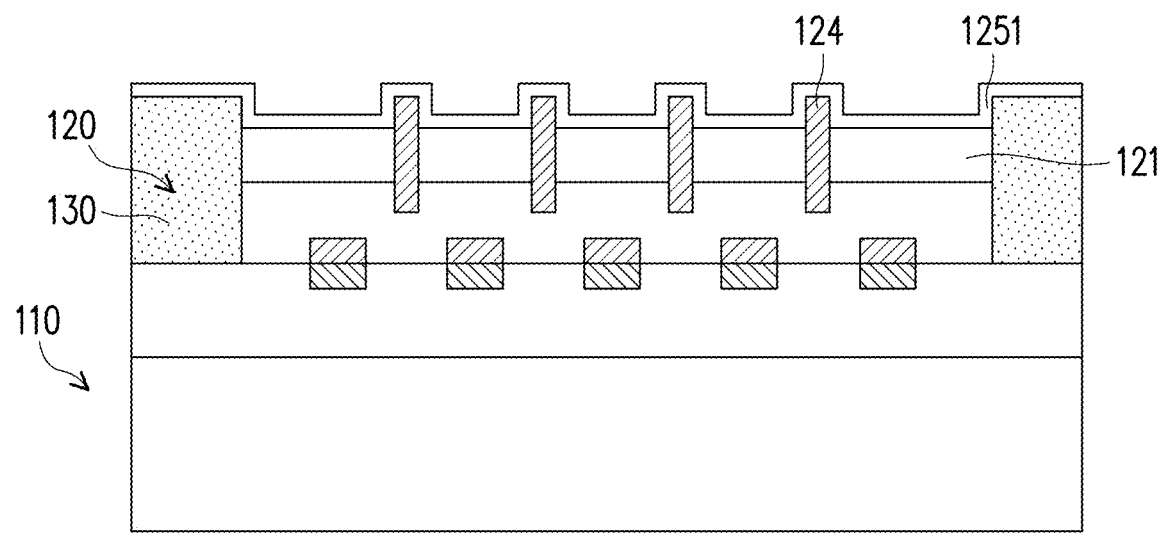
FIG. 29 to FIG. 32 illustrate cross sectional views of intermediate stages in the manufacturing of a semiconductor package according to some embodiments of the present disclosure.
Figure 30:
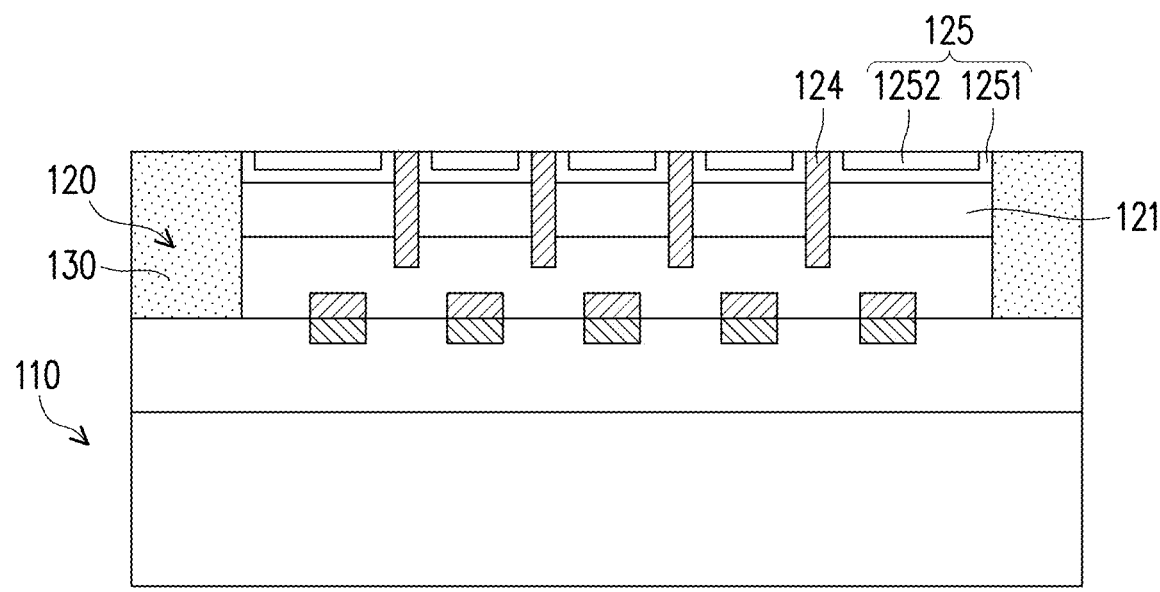

With reference to FIG. 29, in some embodiments, the isolation layer 125 may be a composite layer. For example, the isolation layer 125 may include a water resisting layer 1251 and an insulation layer 1252. FIG. 29 to FIG. 32 illustrate an example of the process for forming the composite isolation layer 125, and the process illustrated in FIG. 29 to FIG. 32 may be performed after the process illustrate in FIG. 3, which is the removal of the back portion of the substrate 121 of the second die 120. After the back portion of the substrate 121 is removed, the through vias 124 protrudes from the back of the substrate 121, and recesses RC are formed across the substrate 121 as shown in FIG. 3. Then, a water resisting layer 1251 is formed over the back of the substrate 121 as shown in FIG. 29. In some embodiments, the water resisting layer 1251 may also cover the exposing surfaces (e.g., the top surfaces and a part of the side surfaces) of the through vias 124 and the top surface of the encapsulating material 130. In some embodiments, the water resisting layer 1251 is a conformal layer, that is, the water resisting layer 1251 has a substantially equal thickness extending along the region on which the water resisting layer 1251 is formed. The water resisting layer 1251 may include silicon nitride (SiN), or the like. In some embodiments, the water resisting layer 1251 may cover the back of the substrate 121, the exposing surface of the through vias 124 and the exposing surface of the encapsulating material 130 to provide water resisting property to the second die 120 and the encapsulating material 130. In one example, the water resisting layer 1251 may have a thickness ranging between about 500 angstrom to about 750 angstrom. The water resisting layer 1251 may be formed by using various deposition techniques such as ALD, PVD, CVD, or other suitable techniques. Then, the insulating layer 1252 may be formed over the water resisting layer 1251 to fill the remaining portion of the recesses as shown in FIG. 30. The insulating layer 1252 may be formed by a suitable deposition process such as CVD, or the like. Thereafter, a planarization process such as a CMP process may be performed to remove excess portions of the water resisting layer 1251 and the insulating layer 1252 until the through vias 124 and the encapsulating material 130 are revealed. In some embodiments, after the planarization process is performed, the top surfaces of the water resisting layer 1251 and the insulating layer 1252 are substantially coplanar, within process variations, with the top surfaces of the through vias 124 and the encapsulating material 130, and the water resisting layer 1251 laterally encapsulates a part of the side surfaces of the through vias protruding from the substrate 121 of the second die 120.

Figure 31:
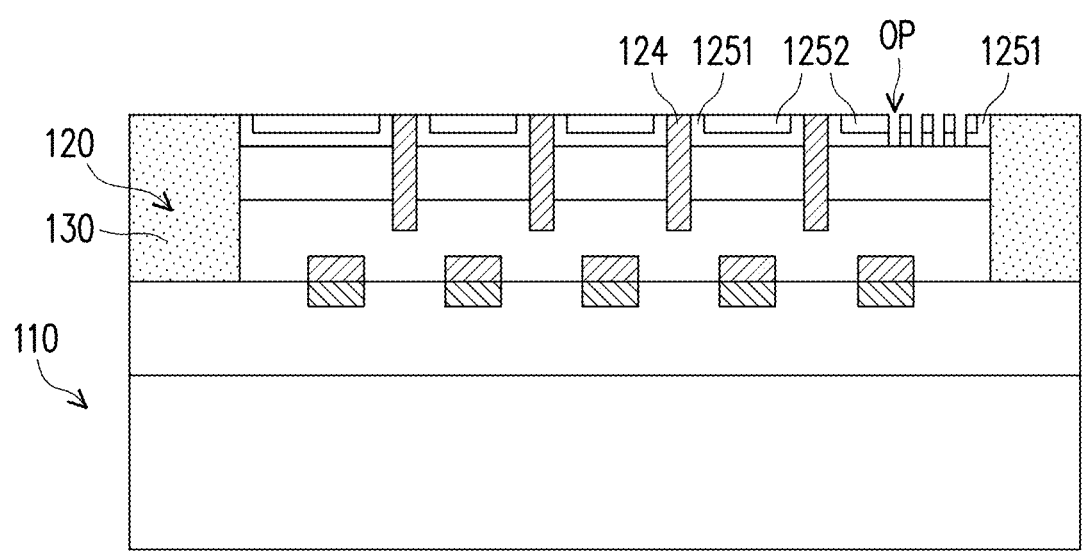

Referring to FIG. 31, then, a plurality of openings OP are formed by an etching process. In detail, the openings OP may be formed by transferring the pattern of a mask layer to the water resisting layer 1251 and the insulating layer 1252 (and may be the substrate 121 of the second die 120) using the etching process. In some embodiments, the openings OP at least extend through the water resisting layer 1251 and the insulating layer 1252.

Figure 32:
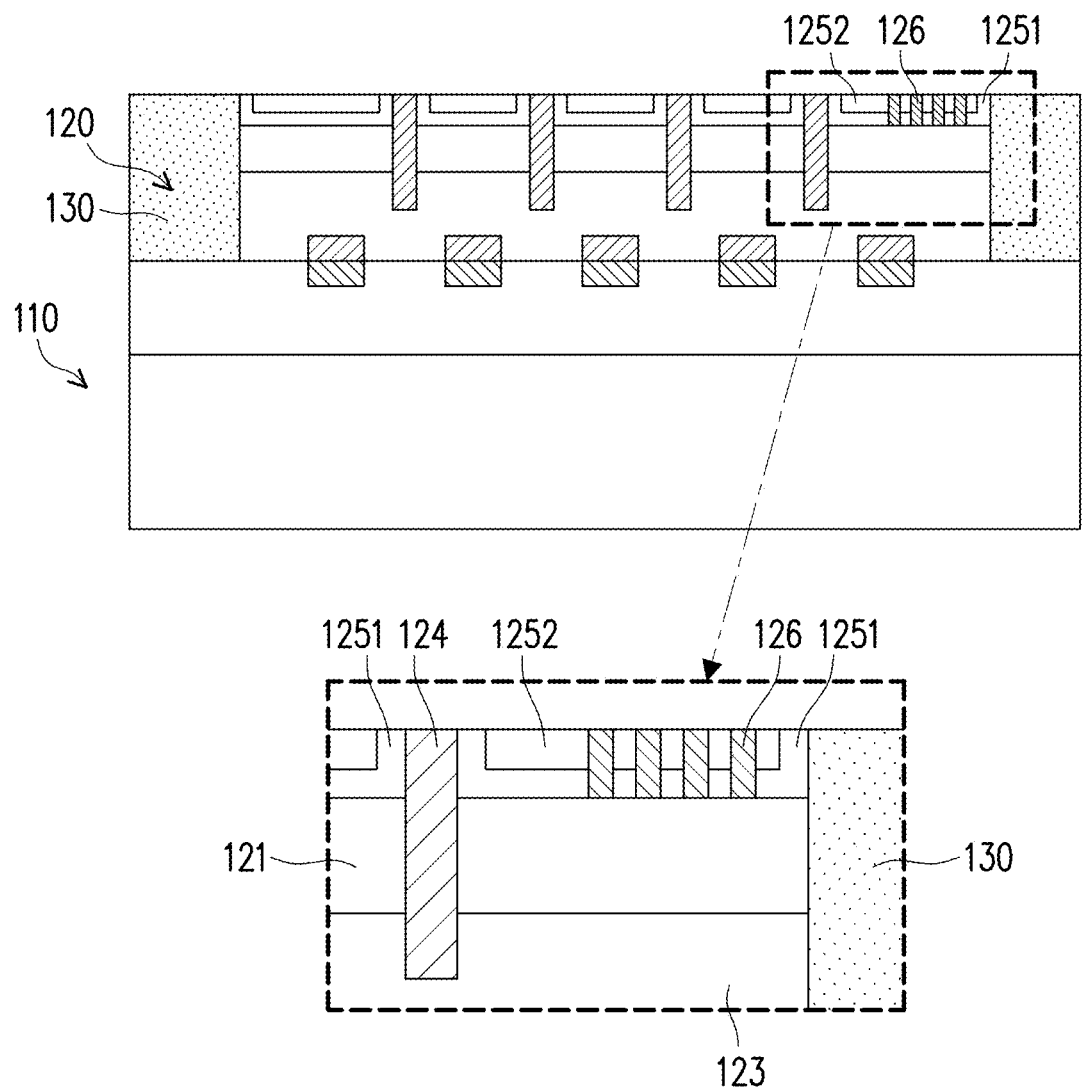

Then, referring to FIG. 32, the openings OP are filled with, for example, conductive material or dielectric material to form the alignment marks 126. In the present embodiment, the alignment marks 126 are formed by filling the openings OP with conductive material. For example, the alignment marks 126 may include one or more conductive materials, such as copper, tungsten, other conductive metals, or the like, and may be formed, for example, by electroplating, electroless plating, or the like. The conductive material of the alignment marks 126 may be the same as that of the through vias 124. In some embodiments, the conductive material of the alignment marks 126 may be different from the conductive material of the through vias 124 since they are formed by different processes in separate steps. In other embodiments, the alignment marks 126 are formed by filling the openings OP with dielectric material, such as the dielectric layer of the redistribution structure. Accordingly, since the composite isolation layer 125 (including the water resisting layer 1251 and the insulating layer 1252) is formed after the formation of the through vias 124 and before the formation of the alignment marks 126, the insulating layer 1252 and the through vias 124 are isolated from each other by the water resisting layer 1251, while the insulating layer 1252 and the water resisting layer 1251 are both in contact with a part of the side surface of the alignment marks 126.

Figure 33:
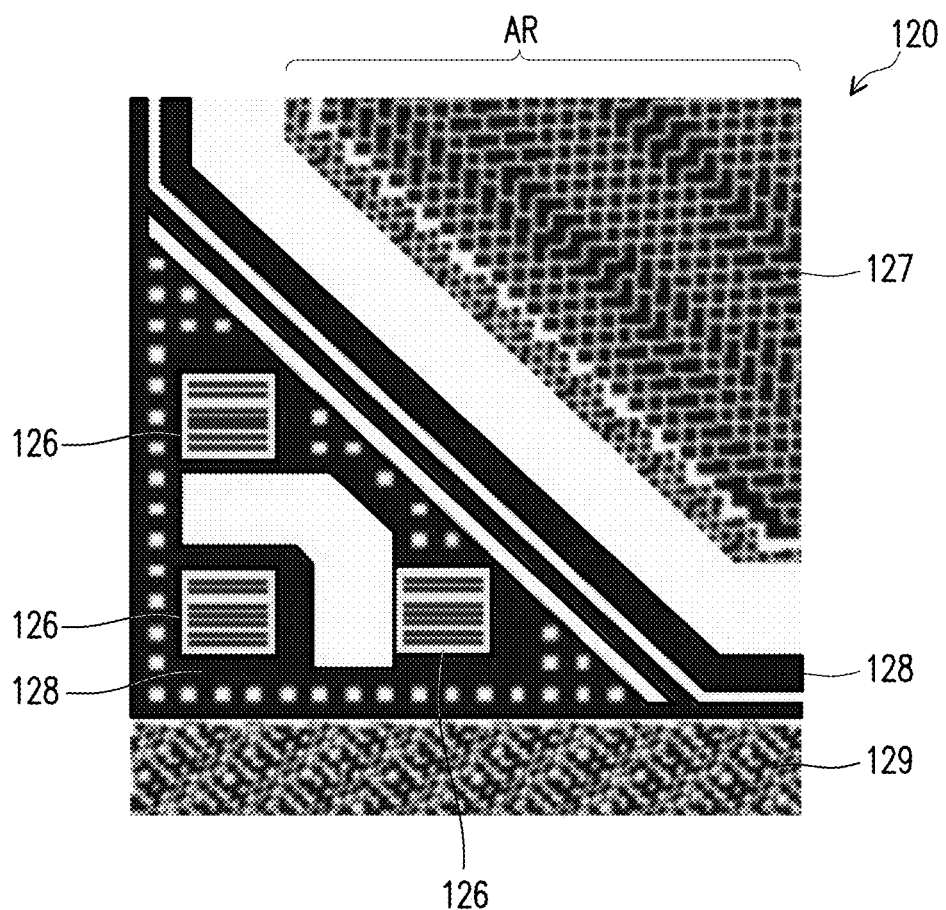
FIG. 33 illustrates a partial top view of a die of a semiconductor package according to some embodiments of the present disclosure.

FIG. 33 illustrates a partial top view of a die of a semiconductor package according to some embodiments of the present disclosure. It is noted that the semiconductor package shown in FIG. 33 contains many features same as or similar to the semiconductor package disclosed in the previous embodiments. For purpose of clarity and simplicity, detail description of same or similar features may be omitted, and the same or similar reference numbers denote the same or like components.

In accordance with some embodiments of the disclosure, FIG. 33 illustrate a top view of a die corner, which may also be called as a die corner circuit forbidden (DCCF) region. In some embodiments, the die corner region shown in FIG. 33 is located at the corners of the second die 120. The integrated circuit is excluded from the die corner region because it is a region that may experience greater stress during and after backend processing such as die sawing and packaging. The die corner region may include a dummy metal pattern 127, 129 for stress relief. The dummy metal pattern may include a first dummy metal pattern 127 and a second dummy metal pattern 129. The first and second dummy metal patterns 127 and 129 may be positioned within the die corner region to be proximate to each other and configured such that the first dummy metal pattern 127 is within and/or closer to an active region (integrated circuit region) AR, and the second dummy metal pattern 129 is closer to outline of die corner region (e.g., along the scribe line), as illustrated in FIG. 33. The die corner region may further include a portion of a seal ring 128 surrounding the active region AR, and the alignment marks 126 may be disposed outside the active region AR, and may be located within the seal ring 128.

In some embodiments, the alignment marks 126 are disposed in at least one corner of the second die 120. For example, the alignment marks 126 are disposed within the die corner region shown in FIG. 33. Such a combined structure (e.g., die corner region) having the alignment marks 126 co-located with the first dummy metal pattern 127, the second dummy metal pattern 129, and the seal ring 128 can use die area more efficiently and save more die area for the integrated circuit layout. In accordance with some embodiments of the disclosure, the alignment marks 126 may be disposed within the seal ring 128, as illustrated in FIG. 33, within the first dummy metal pattern 127, within the second dummy metal pattern 129, or combinations thereof. The alignment marks 126 may be isolated from the seal ring 128, the first dummy metal pattern 127, and/or the second dummy metal pattern 129.

Figure 34:
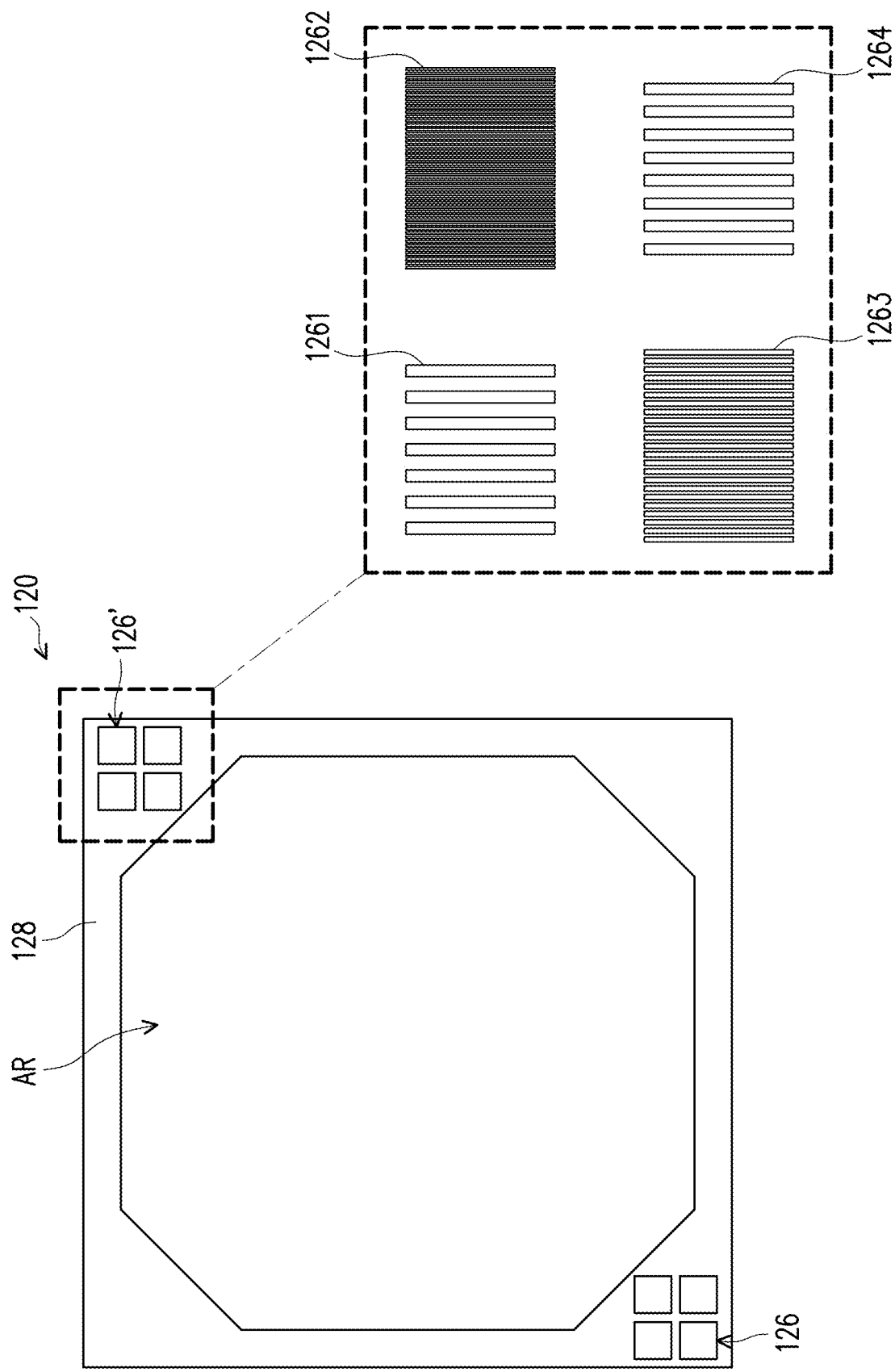
FIG. 34 illustrates a schematic top view and a partial enlarged view of a die of a semiconductor package according to some embodiments of the present disclosure.

FIG. 34 illustrates a schematic top view and a partial enlarged view of a die of a semiconductor package according to some embodiments of the present disclosure. It is noted that the semiconductor package shown in FIG. 34 contains many features same as or similar to the semiconductor package disclosed in the previous embodiments. For purpose of clarity and simplicity, detail description of same or similar features may be omitted, and the same or similar reference numbers denote the same or like components.

Referring to FIG. 34, in accordance with some embodiments of the disclosure, the second die 120 may include more than one sets of alignment marks 126 and 126'. In some embodiments, a plurality of sets of the alignment marks may be disposed on a plurality of corners of the second die 120 respectively. For example, the alignment marks may include a first set of alignment marks 126 and a second set of alignment marks 126', which are disposed at different corners, such as two diagonal corners of the second die 120, as illustrated in FIG. 34, respectively. In some embodiments, the two sets of alignment marks 126 and 126' may be disposed adjacent to opposite corners of the second die 120. In some embodiments, the two sets of alignment marks 126 and 126' are formed adjacent to two corners of second die 120, wherein the two corners are neighboring corners formed by a same edge of second die 120. It is noted that, although two sets of the alignment marks 126 and 126' are illustrated herein, more or less sets of the alignment marks may be provided. The disclosure is not limited thereto. In some embodiments, multiple sets of alignment marks may be disposed adjacent to each of the corners of the second die 120.

The alignment marks 126 and 126' may be disposed within the sealing ring 128 surrounding the active region AR.

In some embodiments, each set of alignment marks 126/126' may have the same pattern. For example, the first set of alignment marks 126 and the second set of alignment marks 126' may each have the same pattern shown in the partial enlarged view of FIG. 34, which includes a plurality of subsets of alignment marks 1261, 1262, 1263, 1264, and the corresponding pitches of the subsets of alignment marks 1261, 1262, 1263, 1264 may be different from one another. In other embodiments, the pattern of each set of the alignment marks may be different from one another.

Figure 35:
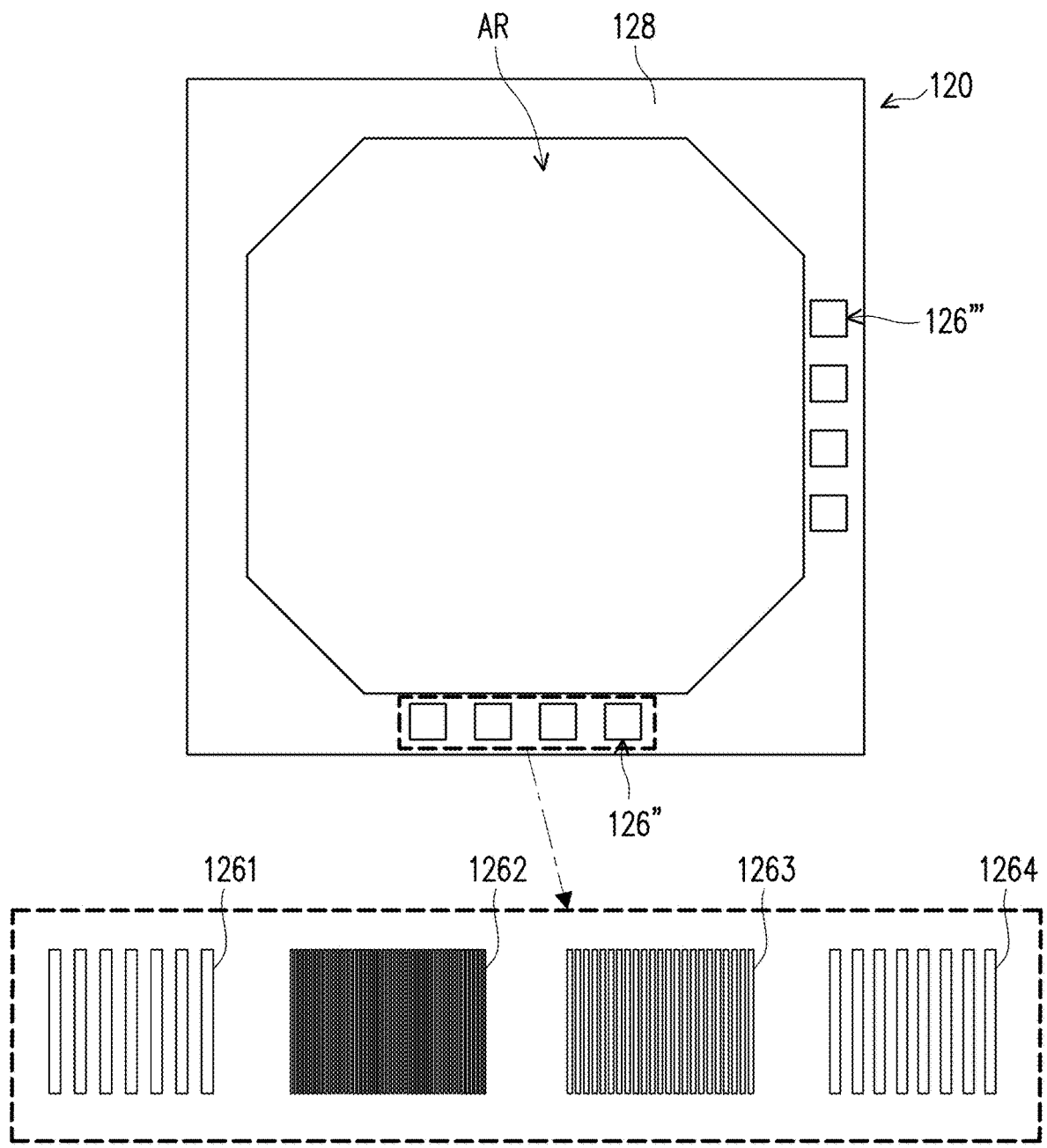
FIG. 35 illustrates a schematic top view and a partial enlarged view of a die of a semiconductor package according to some embodiments of the present disclosure.

FIG. 35 illustrates a schematic top view and a partial enlarged view of a die of a semiconductor package according to some embodiments of the present disclosure. It is noted that the semiconductor package shown in FIG. 35 contains many features same as or similar to the semiconductor package disclosed in the previous embodiments. For purpose of clarity and simplicity, detail description of same or similar features may be omitted, and the same or similar reference numbers denote the same or like components.

Referring to FIG. 35, in accordance with some embodiments of the disclosure, the second die 120 may include more than one sets of alignment marks (e.g., two sets of alignment marks 126" and 126'''). In some embodiments, a plurality of sets of the alignment marks may be disposed on a plurality of sides of the second die 120 respectively. For example, the alignment marks may include two sets of alignment marks 126" and 126''', which are disposed at two adjacent sides of the second die 120, respectively, as shown in FIG. 35. The two sets of alignment marks 126" and 126''' may be formed adjacent to two sides of second die 120, wherein the two sides are neighboring sides forming the same corner of second die 120. In some embodiments, the two sets of alignment marks 126" and 126''' may be disposed adjacent to two opposite sides of the second die 120. It is noted that, although two sets of the alignment marks 126" and 126''' are illustrated herein, more or less sets of the alignment marks may be provided. The disclosure is not limited thereto. In some embodiments, multiple sets of alignment marks may be disposed adjacent to each of the sides of the second die 120. The alignment marks 126" and 126''' may be disposed within the sealing ring 128 surrounding the active region AR.

In some embodiments, each set of alignment marks 126"/126''' may have the same pattern. For example, the two sets of alignment marks 126" and 126''' may each have the same pattern shown in the partial enlarged view of FIG. 35, which includes a plurality of subsets of alignment marks 1261, 1262, 1263, 1264, and the corresponding pitches of the subsets of alignment marks 1261, 1262, 1263, 1264 may be different from one another. In other embodiments, the pattern of each set of the alignment marks may be different from one another.

Figure 36:
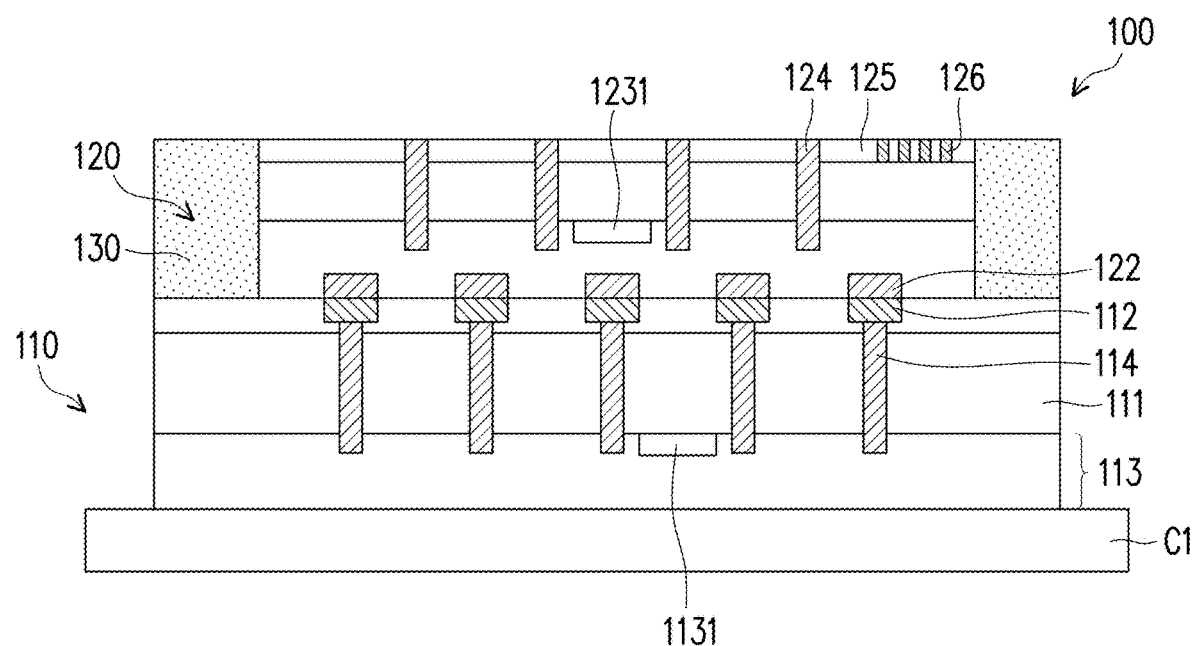
FIG. 36 to FIG. 37 illustrate cross sectional views of intermediate stages in the manufacturing of a semiconductor package according to some embodiments of the present disclosure.
Figure 37:
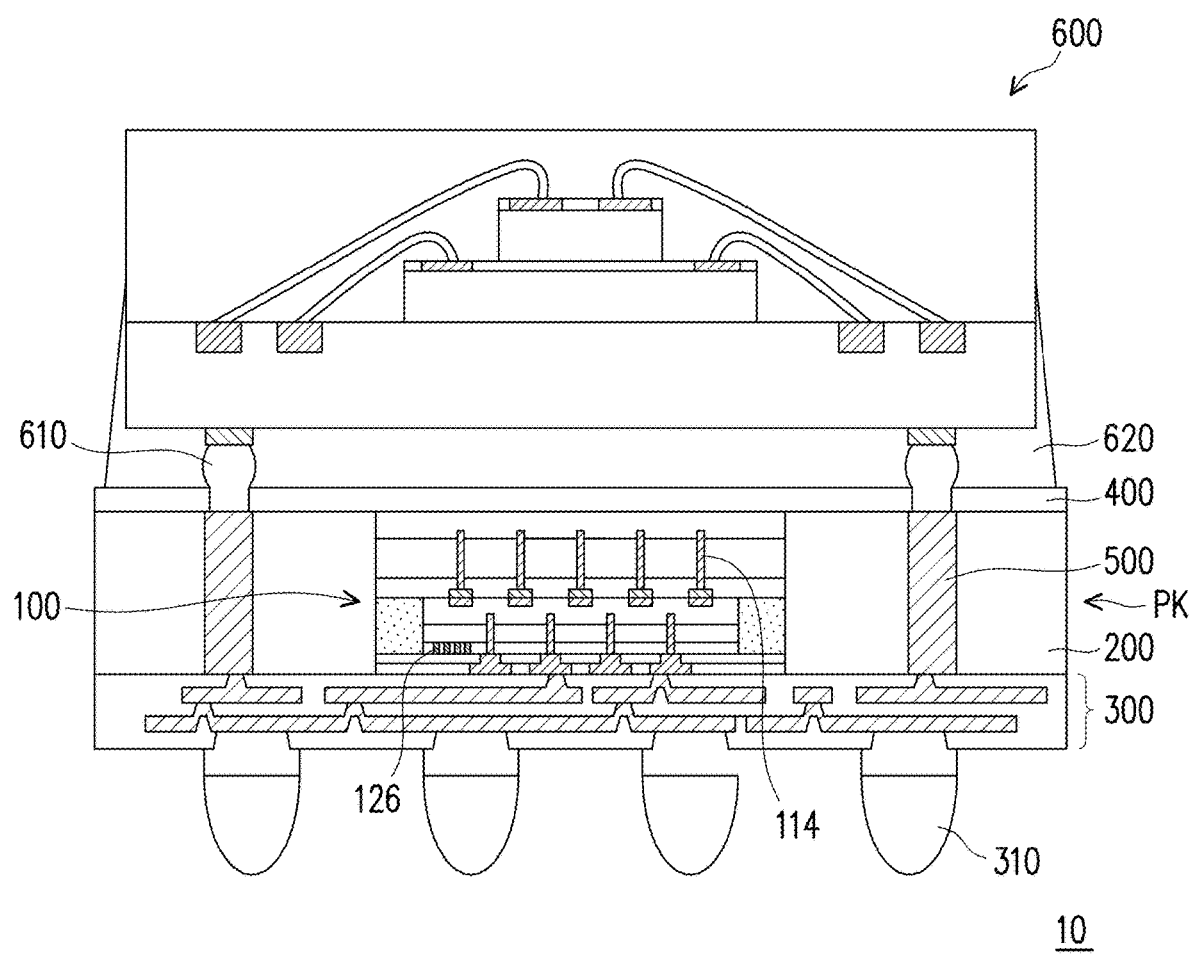

FIG. 36 to FIG. 37 illustrate cross sectional views of intermediate stages in the manufacturing of a semiconductor package according to some embodiments of the present disclosure. It is noted that the semiconductor package shown in FIG. 36 and FIG. 37 contain many features same as or similar to the semiconductor package disclosed in the previous embodiments. For purpose of clarity and simplicity, detail description of same or similar features may be omitted, and the same or similar reference numbers denote the same or like components.

Referring to FIG. 36, in accordance with some embodiments of the disclosure, the second die 120 may be bonded to the first die 110 in a face-to-back configuration. That is, the front (active) surface of the second die 20 faces the back surface of the first die 110. In some embodiments, at least one integrated circuit device 1131 are formed in front side of the first die 110 facing away from the second die 120, as illustrated in FIG. 36. The integrated circuit device 1131 may be formed in a front end of line (FEOL) process in some embodiments.

In some embodiments, the integrated circuit device 1131, such as transistors including gate structure, are formed in front side of the first die 110, while no devices are formed in back side of the first die 110, which faces the second die 120. In addition, the back side of the first die 110 is bonded to the front side of the second die 120, and therefore the resulting stacking structure is a front-to-back (face-to-back) stacking structure.

In some embodiments, a plurality of through (substrate) vias (TSV) 114 extends through the substrate 111 of the first die 110, as illustrated in FIG. 36. The through vias 114 are used to provide electrical connections. The through vias 114 are used to connect the integrated circuit devices 1131 and metal lines formed on the front side (the illustrated bottom side) of substrate 111 to the conductive pads 112 on the backside. In some embodiments, the through vias 114 may extend into the interconnection structure 113 to be in physical and electrical contact with the conductive features of the interconnection structure 113. In some embodiments, the interconnect structure 113 is formed on front side of the first die 110, and the through vias 114 directly contacts conductive features of the interconnect structure 113 on the front side of the first die 110 and the conductive pads 112 on the backside of the first die 110. In some embodiments, the through vias 114 may include liner(s) (not shown) for covering surface thereof. The liner is disposed between the through vias 114 and the substrate 111 to separate the through via 114 from the substrate 111. The liner may surround the sidewalls and/or top surface of the through via 114. The through vias 114 may include copper, copper alloys, aluminum, aluminum alloys, Ta, TaN, Ti, TiN, CoW or combinations thereof. The liner may include dielectric material, such as silicon oxide, silicon nitride, silicon oxynitride or the like, or combinations thereof.

With reference to FIG. 37, in some embodiments, the carrier C1 may be removed, and the similar processes described above regarding FIG. 9 and FIG. 10 may be applied to the semiconductor package 100 to form the package-on-package structure 10 shown in FIG. 37. For example, the semiconductor package 100 shown in FIG. 36 and the through interlayer vias 500 can be provided onto a carrier, and, in the placement of the semiconductor package 100, the alignment marks 126 on the second die 120 can be used to align the position of the semiconductor package 100 to ensure the semiconductor package 100 is placed at the desirable location and that the semiconductor package 100 does not shift or rotate from its intended position and direction. The alignment is performed by determining the relative position of the semiconductor package 100 relative to the positions of the alignment marks 126. The alignment marks 126 are formed by different process from the through vias 124 of the second die 120, such that pitches and patterns of the alignment marks 126 can be different from those of the through vias 1254, so as to meet the fine pitch requirement and provide better resolution.

In addition, the semiconductor package 100 and the through interlayer vias 500 are at least laterally encapsulated by an encapsulating material 200. Then, the redistribution structure 300 is formed over the semiconductor package 100, and the electrical connectors 310 are disposed on the redistribution structure 300 to form the package structure PK. In some embodiments, the electrical terminals 610 are formed over the package structure PK to be electrically connected to the through interlayer vias 500, and another package structure 600 is disposed on the package structure PK and is electrically connected to the through interlayer vias 500 through the electrical terminals 610. The wafer-level package may then be sawed into a plurality of package on package structures 10 independent from one another, with each of the package-on-package structures 10 including one package structure 600 bonded to one package structure PK.

Based on the above discussions, it can be seen that the present disclosure offers various advantages. It is understood, however, that not all advantages are necessarily discussed herein, and other embodiments may offer different advantages, and that no particular advantage is required for all embodiments.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with some embodiments of the disclosure, a semiconductor package includes a first die, a second die, an encapsulating material, and a redistribution structure. The first die includes first bonding pads. The second die is disposed over the first die and includes second bonding pads. The first bonding pads are bonded to the second bonding pads. The second die includes a substrate, a plurality of through vias extending through the substrate, and a plurality of alignment marks. A pitch between adjacent two of the plurality of alignment marks is different from a pitch between adjacent two of plurality of through vias. The encapsulating material is disposed over the first die. The encapsulating material laterally encapsulates the second die. The redistribution structure is disposed over the second die and the encapsulating material. The redistribution structure includes conductive features, which are electrically connected to corresponding ones of the plurality of through vias. In some embodiments, a depth of each of the plurality of alignment marks is different from a depth of each of the plurality of through vias. In some embodiments, the second die further includes an isolation layer disposed between the substrate of the second die and the redistribution structure, wherein the plurality of through vias extend through the isolation layer. In some embodiments, the plurality of alignment marks extends from an upper surface of the isolation layer facing the redistribution structure and extends toward the substrate. In some embodiments, the alignment marks do not overlap with the conductive features of the redistribution structure from a top view. In some embodiments, the redistribution structure comprises an alignment pattern overlapping with the plurality of alignment marks from a top view, wherein the alignment pattern includes a conductive material. In some embodiments, the redistribution structure includes a dielectric material, wherein the dielectric material of the redistribution structure and the alignment marks include a single continuous layer. In some embodiments, the alignment marks comprise conductive material. In some embodiments, the alignment marks are disposed at a corner of the second die. In some embodiments, the alignment marks include a first set of alignment marks and a second set of alignment marks, wherein the first set of alignment marks and the second set of alignment marks are disposed at different corners of the second die or at different sides of the second die. In some embodiments, the second die includes an active region and a seal ring structure surrounding the active region of the second die, wherein the alignment marks are disposed outside the active region. In some embodiments, a cross sectional shape of one of the alignment marks is different from a cross sectional shape of one of the through vias.

In accordance with some embodiments of the disclosure, a semiconductor package includes a first die, a second die, a first encapsulating material, and a first redistribution structure. The second die is disposed over and bonded to the first die. The second die includes a substrate and a plurality of through vias extending through the substrate. The second die includes a plurality of alignment marks. A depth of the alignment marks is different than a depth of the through vias. The first encapsulating material laterally encapsulates the first die and the second die. The first redistribution structure is disposed over the second die and the first encapsulating material. The redistribution structure includes first conductive features electrically connected to the first die and the second die.

In some embodiments, the semiconductor package further includes a second encapsulating material disposed over the first die and laterally encapsulating the second die, and the first encapsulating material laterally encapsulating the first die and the second encapsulating material. In some embodiments, the semiconductor package further includes a second redistribution structure disposed over the second die and the second encapsulating material. The second redistribution structure includes second conductive features electrically connected to the plurality of through vias. The first encapsulating material laterally encapsulates the second redistribution structure. The first redistribution structure is disposed over the second redistribution structure and the first encapsulating material. In some embodiments, the semiconductor package further includes a plurality of through interlayer vias extending through the first encapsulating material.

In accordance with some embodiments of the disclosure, a method includes bonding a first die to a second die, the first die including a plurality of first bonding pads, the second die including a plurality of second bonding pads bonded to corresponding ones the first conductive pads, the second die including a plurality of through vias electrically connected to corresponding ones of the plurality of bonding pads; forming an encapsulating material over the first die, the encapsulating material laterally encapsulating the second die; forming a plurality of alignment marks on the second die, a pitch between an adjacent two alignment marks of the plurality of alignment marks being different from a pitch between an adjacent two through vias of the plurality of through vias; and forming a redistribution structure over the second die and the encapsulating material. In some embodiments, the method further includes removing a back portion of a substrate of the second die, such that the plurality of through vias protrude from the substrate; and providing an isolation layer over the substrate. The isolation layer laterally encapsulates the through vias protruding from the substrate, and the alignment marks are formed on the isolation layer. In some embodiments, forming the alignment marks on the second die further includes forming the alignment marks in the isolation layer. In some embodiments, forming the alignment marks and forming the redistribution structure over the second die and the encapsulating material includes forming recesses in a back surface of the second die; and forming a dielectric layer over the second die and the encapsulating material. The dielectric layer fills the recesses, and portions of the dielectric layer in the recesses form the plurality of alignment marks.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
    a first die, wherein the first die comprises first bonding pads;
    a second die disposed over the first die, wherein the second die comprises second bonding pads, wherein the first bonding pads are bonded to the second bonding pads, wherein the second die comprises a substrate and a plurality of through vias extending through the substrate, wherein the second die comprises a plurality of alignment marks, wherein a pitch between an adjacent two of the plurality of alignment marks is different from a pitch between an adjacent two of plurality of through vias, wherein the plurality of alignment marks extends from an upper surface of the second die, the upper surface of the second die facing away from the first die;
    an encapsulating material disposed over the first die, the encapsulating material laterally encapsulating the second die; and
    a redistribution structure disposed over the second die and the encapsulating material, wherein the redistribution structure comprises conductive features, wherein the conductive features are electrically connected to corresponding ones of the plurality of through vias.

2. The semiconductor package of claim 1, wherein a depth of each of the plurality of alignment marks is different from a depth of each of the plurality of through vias.

3. The semiconductor package of claim 1, wherein the second die further comprises an isolation layer disposed between the substrate of the second die and the redistribution structure, wherein the plurality of through vias extend through the isolation layer.

4. The semiconductor package of claim 3, wherein the plurality of alignment marks extends from an upper surface of the isolation layer facing the redistribution structure toward the substrate.

5. The semiconductor package of claim 1, wherein the plurality of alignment marks do not overlap with the conductive features of the redistribution structure from a top view.

6. The semiconductor package of claim 1, wherein the redistribution structure comprises an alignment pattern overlapping the plurality of alignment marks, wherein the alignment pattern comprises a conductive material.

7. The semiconductor package of claim 1, wherein the redistribution structure comprises a dielectric material, wherein the dielectric material of the redistribution structure and the plurality of alignment marks comprise a single continuous layer.

8. The semiconductor package of claim 1, wherein the plurality of alignment marks comprise conductive material.

9. The semiconductor package of claim 1, wherein the plurality of alignment marks are disposed at a corner of the second die.

10. The semiconductor package of claim 1, wherein the plurality of alignment marks comprises a first set of alignment marks and a second set of alignment marks, wherein the first set of alignment marks and the second set of alignment marks are disposed at different corners of the second die or at different sides of the second die.

11. The semiconductor package of claim 1, wherein the second die comprises an active region and a seal ring structure surrounding the active region of the second die, wherein the plurality of alignment marks is disposed outside the active region.

12. The semiconductor package of claim 1, wherein a cross sectional shape of one of the plurality of alignment marks is different from a cross sectional shape of one of the plurality of through vias.

13. A semiconductor package, comprising:
a first die;
a second die disposed over and bonded to the first die, wherein the second die comprises a substrate and a plurality of through vias extending through the substrate, wherein the second die comprises a plurality of alignment marks, wherein a depth of the plurality of alignment marks is different than a depth of the plurality of through vias;
a first encapsulating material laterally encapsulating the first die and the second die; and
a first redistribution structure disposed over the second die and the first encapsulating material, wherein the first redistribution structure comprises first conductive features electrically connected to the second die, wherein the first redistribution structure directly contacts the plurality of alignment marks.

14. The semiconductor package of claim 13, further comprising a second encapsulating material disposed over the first die and laterally encapsulating the second die, the first encapsulating material laterally encapsulating the first die and the second encapsulating material.

15. The semiconductor package of claim 14, further comprising a second redistribution structure disposed over the second die and the second encapsulating material, wherein the second redistribution structure comprises second conductive features electrically connected to the plurality of through vias, wherein the first encapsulating material laterally encapsulates the second redistribution structure, wherein the first redistribution structure is disposed over the second redistribution structure and the first encapsulating material.

16. The semiconductor package of claim 13, further comprising a plurality of through interlayer vias extending through the first encapsulating material.

17. A semiconductor package, comprising:
a first die, wherein the first die comprises a plurality of first bonding pads;
a second die, wherein the second die comprises a plurality of second bonding pads bonded to corresponding ones of the plurality of first bonding pads, wherein the second die comprises a plurality of through vias, wherein the second die comprises:
a semiconductor substrate;
an isolation layer over the semiconductor substrate; and
a plurality of first alignment marks in the isolation layer, wherein a pitch between an adjacent two first alignment marks of the plurality of first alignment marks is different from a pitch between an adjacent two through vias of the plurality of through vias;
an encapsulating material over the first die, wherein the encapsulating material laterally encapsulates the second die, wherein a surface of the encapsulating material is level with a surface of the isolation layer; and
a redistribution structure over the second die and the encapsulating material, wherein the isolation layer is between the semiconductor substrate and the redistribution structure.

18. The semiconductor package of claim 17, wherein the redistribution structure comprises:
a first dielectric layer over the isolation layer; and
a second alignment mark in the first dielectric layer, wherein the second alignment mark overlaps at least one of the plurality of first alignment marks.

19. The semiconductor package of claim 18, wherein the redistribution structure further comprises:
a second dielectric layer over the first dielectric layer; and
a third alignment mark in the second dielectric layer.

20. The semiconductor package of claim 17, wherein the plurality of first alignment marks extends through the isolation layer.

* * * * *